(12) United States Patent
Gendai

(10) Patent No.: US 6,492,842 B2
(45) Date of Patent: Dec. 10, 2002

(54) LOGIC CIRCUIT

(75) Inventor: Yuji Gendai, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/888,533

(22) Filed: Jun. 26, 2001

(65) Prior Publication Data

US 2002/0039035 A1 Apr. 4, 2002

(30) Foreign Application Priority Data

Jun. 27, 2000 (JP) .......................................... 2000-192026

(51) Int. Cl.[7] .............................................. H03K 19/086
(52) U.S. Cl. ........................ 326/126; 326/115; 326/127
(58) Field of Search ................................. 326/114, 115, 326/125, 126, 127

(56) References Cited

U.S. PATENT DOCUMENTS 4,349,895 A * 9/1982 Isogai ........................ 365/230
5,467,044 A * 11/1995 Ashe et al. .................. 327/333

* cited by examiner

Primary Examiner—Michael Tokar
Assistant Examiner—Anh Q Tran
(74) Attorney, Agent, or Firm—Rader, Fishman, & Grauer PLLC; Ronald P. Kananen, Esq.

(57) ABSTRACT

The invention provides a logic circuit which has a sufficient load driving capacity even in its operation with a low power supply voltage and can operate at a high speed. In a next stage to a differential circuit having an output stage for which an emitter followers are used, a folding circuit in which a pair of transistors of a diode connection are used to raise the signal level of differential outputs of the differential circuit.

15 Claims, 14 Drawing Sheets

F I G. 13
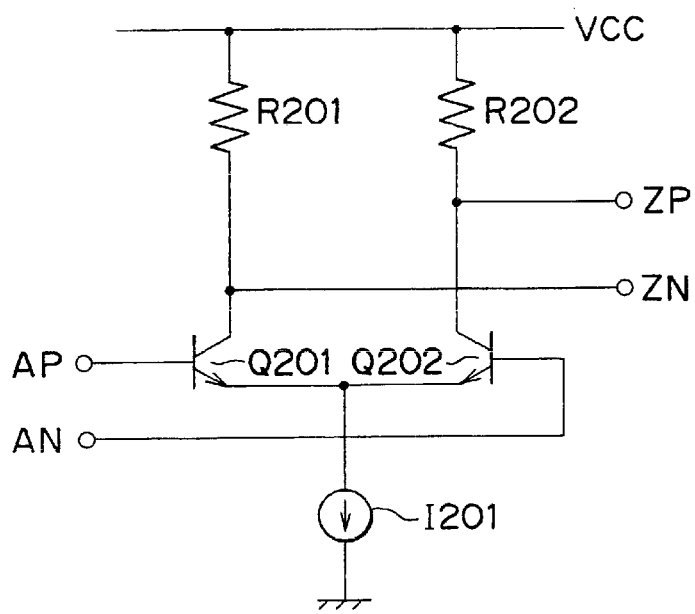
F I G. 14
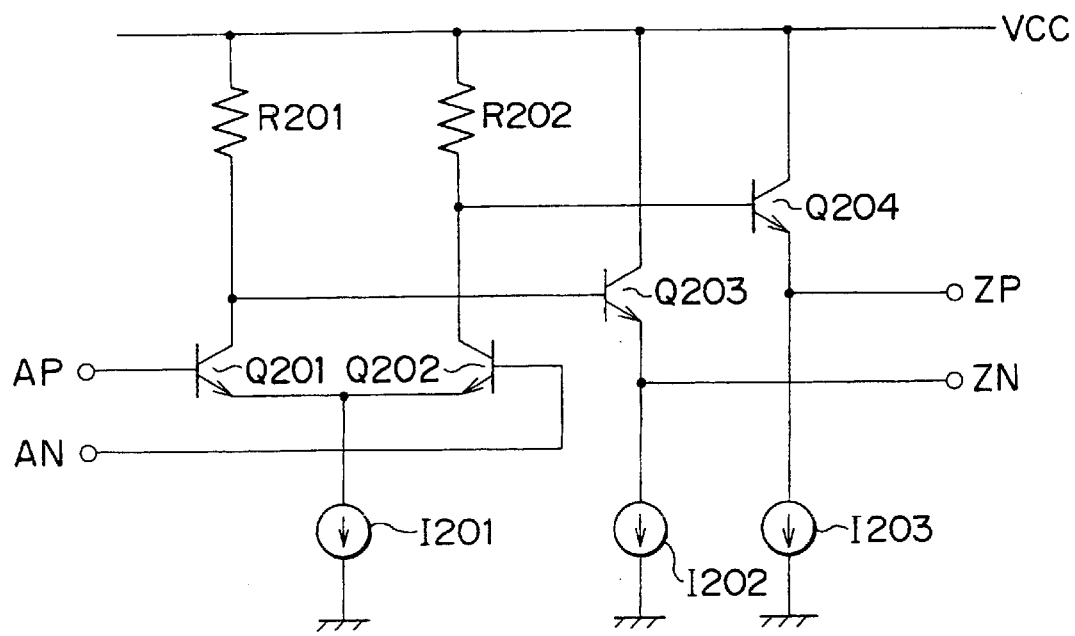

LOGIC CIRCUIT

BACKGROUND OF THE INVENTION

This invention relates to a logic circuit such as an OR/NOR circuit, an XOR/XNOR circuit, a selector circuit or a latch circuit, and more particularly to a logic circuit which can operate at a high speed with a low power supply voltage.

A demand to lower the operating voltage of a logic circuit is increasing from the point of view of refinement of a process or reduction of power consumption. Thus, a configuration of a conventional differential circuit which is a basic logic circuit is described first, and then restriction conditions to lower the operating voltage are described.

An example of circuit configuration of a differential circuit wherein a bipolar element is used is shown in FIG. 13. Referring to FIG. 13, the differential circuit shown includes differential pair transistors Q201 and Q202 whose emitters are connected commonly, a current source I201 connected between the emitter common connecting point of the differential pair transistors Q201 and Q202 and the ground, and a pair of resistors R201 and R202 connected between the collectors of the differential pair transistors Q201 and Q202 and a power supply line (power supply voltage VCC), respectively.

A circuit of a form which includes the differential circuit or a modification to the differential circuit is generally referred to as ECL (Emitter Coupled Logic) circuit. It is to be noted that the following argument applies substantially similarly to a circuit which employs a MOS element. In the differential circuit shown in FIG. 13, a differential signal AP/AN inputted to the input terminals of the differential circuit determines a differential signal ZP/ZN from output terminals of the differential circuit. Although the logic operation of the differential circuit normally is that of a buffer circuit, actually the differential circuit otherwise operates also as a NOT circuit depending upon the correspondence between the signal levels and the logic values.

For example, if the relationship AP>AN between the potentials AP and AN at the input terminals corresponds to the "true" of the logic value and the relationship ZP>ZN between the potentials ZP and ZN at the output terminals corresponds to the "true" of the logic value, then the circuit of FIG. 13 operates as a mere buffer circuit. On the other hand, if the logic correspondence of the input or the output is reversed, for example, if ZP>ZN corresponds to the "false" of the logic value, then the same circuit now operates as a NOT circuit.

It is to be noted that this is a common technique used in configuration of a logic circuit which uses a differential signal. In other words, the logic reversal (NOT) can be implemented only by connecting a differential signal reversely.

Since a differential circuit by itself in most cases has an insufficient driving capacity for a load, an emitter follower is often added to an output stage of the differential circuit. In particular, referring to FIG. 14, the differential circuit shown in FIG. 13 additionally includes a series circuit of a transistor Q203 and a current source I202 and another series circuit of a transistor Q204 and a current source I203 connected in parallel to each other between the power supply line and the ground. The bases of the transistors Q203 and Q204 are connected to the collectors of the differential pair transistors Q201 and Q202, respectively, and a differential output is derived from the emitters of the transistors Q203 and Q204.

Where the configuration wherein the emitter follower transistors Q203 and Q204 are added to the output stage of the differential circuit in this manner is adopted, the output logic level drops by the base-emitter voltage VBE of the emitter follower transistors Q203 and Q204. Since a conventional ECL circuit uses a comparatively high voltage around 4.5 V as such power supply voltage VCC, the drop of such a voltage as mentioned above does not matter very much.

One of advantages of an ECL circuit is that, since it uses a technique of series gating or wired ORing of emitter followers, various logic functions can be realized without so much increasing the delay of a signal. In the following, several examples of such circuit are described.

The first example is a series gate AND circuit, and a circuit configuration of it is shown in FIG. 15. It is to be noted that, in FIG. 15, like elements to those of FIG. 13 are denoted by like reference characters. Referring to FIG. 15, the series gate AND circuit includes differential pair transistors Q205 and Q206 provided on the ground side with respect to the differential pair transistors Q201 and Q202 and having the emitters connected commonly.

The collector of the transistor Q205 is connected to the emitter common connecting point of the differential pair transistors Q201 and Q202, and the collector of the transistor Q206 is connected to the ZP side output terminal together with the collector of the transistor 0202. Further, the current source I201 is connected between the emitter common connecting point of the differential pair transistors Q205 and Q206 and the ground.

In the AND circuit having the configuration described above, where the potentials at the input terminals of the A system are represented by AP and AN and the potentials at the input terminals of the B system by BP and BN while the potentials at the output terminals by ZP and ZN, ZP >ZN is satisfied only when AP >AN and BP >BN.

This condition can be written by a logic formula as $$Z = A \wedge B \tag{1}$$

In the expression (1), the "true" of the logic variable "A" is allocated to the state of AP >AN. This similarly applies to "B" and "Z". The mark "$\wedge$" represents the logic AND.

Here, in order to prevent the transistor Q205 from being saturated, it is required that the signal level of the B system side be lower than that of the A system side. Although multi-stage series gating is possible with an ECL circuit, as the number of stages increases, a correspondingly lower logic level is required. Consequently, the number of stages of possible series gating is restricted.

Where the De Morgan theorem is used, the negation of the both sides of the expression (1) is given by $$!Z = !(A \wedge B) = !A \vee !B \tag{2}$$

where "!" represents the reversal of the logic, and "$\vee$" represents the logic OR. The expression (2) indicates that, if the correspondence of the inputs/outputs to the logic values is reversed, then the same circuit functions as a logic OR circuit.

As another method for realizing the logic OR, a wired OR connection or a collector dot is known. An example of OR circuit which employs a wired OR connection and a collector dot is shown in FIG. 16. Referring to FIG. 16, like elements to those of FIG. 14 are denoted by like reference characters, and the circuit shown in FIG. 16 adopts a quite same configuration of a differential circuit as that of FIG. 14 in which it has an emitter follower configuration at an output stage thereof.

Meanwhile, the emitter common connecting point of the differential pair transistors Q205 and Q206 is connected to the ground through a current source I204. The collector of the transistor Q205 is connected to the collector of the transistor Q201. The connecting point between the two collectors is a collector dot. Meanwhile, the collector of the transistor Q206 is connected to the power supply line through a resistor R203.

The base of a transistor Q207 is connected to the collector of the transistor Q206. The collector of the transistor Q207 is connected to the power supply line, and the emitter of the transistor Q207 is connected commonly to the emitter of the transistor Q204. The connection of the emitters is a wired OR connection and connected to the ground through the current source I203.

In the circuit configuration described above, the potential ZP at the output terminal connected to the wired OR connection depends upon a higher one of base voltages at the transistor Q204 and the transistor Q207, but is lower by the base-emitter voltage VBE than the higher base voltage. Therefore, if the state wherein the base potential is higher is regarded as logic true, then the wired OR connection acts as a logic OR circuit.

A wired OR connection can be modified to accept multiple inputs readily, and to this end, it is only required to merely connect emitter follower outputs of n ECL circuits. The number n of ECL circuits may be a considerable great number, and, for example, n=8 can be permitted sufficiently. If an excessively great number of transistors are connected by a wired OR connection, then this gives rise to a problem that not only the parasitic capacitance becomes so high as to make the circuit operation slow but also the DC amplitude becomes small.

Since a reversed signal cannot be produced merely by a wired OR connection, in order to obtain a differential output, a circuit called collector dot described above is used frequently in combination with a wired OR connection. Since the potential at the collector common connecting point of the transistors Q201 and Q205 which is a collector dot exhibits a high level when both of the transistors Q201 and Q205 are off, the negation of the wired OR is produced.

The low level of the potential at the collector dotting differs depending upon whether only one of the transistors Q201 and Q205 is on or both of them are on. If an n-input logic circuit is produced directly in this manner, then the low level is separated into n different levels and has an n-fold amplitude at the maximum. This amplitude variation is unsuitable for high-speed operation, and in order to prevent the low level from becoming excessively low, a diode is sometimes connected in parallel to a resistor. However, the clipping voltage in this instance in most cases becomes excessively high.

A latch circuit which employs an ECL circuit popularly uses a latched comparator circuit configuration. An example of circuit configuration of a latched comparator circuit is shown in FIG. 17.

Referring to FIG. 17, the latched comparator circuit shown includes differential pair transistors Q301 and Q302 whose emitters are connected commonly, differential pair transistors Q303 and Q304, and differential pair transistors Q305 and Q306. The collectors of the differential pair transistors Q301 and Q302 are connected to a power supply Vcc through resistors R301 and R302, respectively.

The collector and the base of the transistor Q303 are connected to the collectors of the differential pair transistors Q301 and Q302, respectively, and the collector and the base of the transistor Q304 are connected to the collectors of the transistor Q302 and Q301, respectively. The collectors of the differential pair transistors Q305 and Q306 are connected to the emitter common connecting points of the differential pair transistors Q301 and Q302 and the differential pair transistors Q303 and Q304, respectively. The emitter common connecting point of the differential pair transistors Q305 and Q306 is connected to the ground through a current source I301.

When the potential CLKN at a clock input terminal of the latch circuit having such a latched comparator circuit configuration as described above keeps the high level, the transistor Q305 is on, and the latch circuit acts as a buffer. When the potential CLKP at the other clock input terminal of the latch circuit changes from the low level to the high level, the gain of the differential pair transistors Q301 and Q302 decreases gradually, and states of the potentials ZP and ZN at output terminals of the latch circuit at the point of time are inherited to a latch circuit (positive feedback circuit) formed from the differential pair transistors Q303 and Q304.

Now, it is examined to which level the power supply voltage VCC can be lowered with an ECL circuit. If the input signal level to the circuit shown in FIG. 13 is at the VCC level, then the emitter potential of the differential pair transistors Q201 and Q202 is VCC−VBE. Where the lowest operation enabling voltage of the current source I201 is represented by VTC, it is necessary to satisfy the following expression (3):

$$VCC-VBE>VTC \qquad (3)$$

Actually, since a margin equal to approximately one half (depending upon the signal waveform) of the logic amplitude VSW of the input signal is necessary, the condition to determine the lowest operating voltage for the differential pair is given by $$VCC>VBE+(VSW/2)+VTC \qquad (4)$$

In the emitter follower of FIG. 14, since the logic amplitude VSW has an influence directly on the operating voltage of the current source I202, the lowest operating voltage is a little more severer and given by $$VCC>VBE+VSW+VTC \qquad (5)$$

However, where the output of the circuit of FIG. 14 drives a differential pair in the next stage, the condition for the power supply voltage VCC becomes severer by an amount corresponding to the base-emitter voltage VBE. The reason is that, as can be recognized from an imaginary connection of the output terminals to the input terminals of the circuit of FIG. 14, the emitter potential of the differential pair transistors Q201 and Q202 becomes equal to VCC−2VBE, and therefore, the condition given by $$VCC>2VBE+(VSW/2)+VTC \qquad (6)$$

is required. In particular, although the emitter follower can operate itself in the proximity of the lowest power supply voltage of the ECL circuit, it can not drive anything. In other words, the power supply voltage of the expression (4) merely allows adoption of a logic configuration of direct coupling of a differential pair.

Now, a series gating of transistors is considered. Referring to FIG. 15, the emitter potential of the differential pair transistors Q201 and Q202 is VCC−VBE at the highest. The emitter potential of the transistors Q203 and Q204 must be lower than VCC−VBE−VSAT if the lowest VSAT (saturation voltage) with which the transistors can operate is assured. Therefore, the condition is given by $$VCC > VBE + VSAT + (VSW/2) + VTC \quad (7)$$

Where a logic circuit is formed from an ECL circuit, the restriction provided by the expression (4) is very severe because it allows formation only of a buffer. The restriction provided by the expression (7) seems to be a limit for practical use. Quantitatively, for a bipolar element, VBE≡0.9 V (when the temperature is low), VSAT ≡0.3 V, VSW≡0.2 V, and VTC≡0.5 V or so. By substituting the values into the expression (7), $$VCC > 1.8 \ V \quad (8)$$

is determined as an operation limit of a bipolar ECL circuit.

Various means are required to configure a logic circuit which achieves the limit voltage given above. First, in order to use the limit of the saturation voltage VSAT, a potential lower by the saturation voltage VSAT than the power supply voltage VCC is required as an operation point of the B system side of FIG. 15. This can be realized by configuring a level shift circuit which includes, for example, as shown in FIG. 18, a resistor R204 connected between power supply side end portions of the resistors R201 and R201 and the power supply line such that, where the resistance value of the resistor R204 is represented by R and the current value of the current source I201 is represented by I, R·I=VSAT may be satisfied.

In the level shift circuit of the configuration described above, it is required that the differential pair transistors Q201 and Q202 be not saturated with the input potential to the A system side. In order to satisfy the requirement, according to circumferences, it is necessary to connect a plurality of such circuits as shown in FIG. 18 in series gating in several stages to gradually lower the signal level.

It is another problem in achievement of the expression (7) that an emitter follower cannot be used. In order to increase the driving capacity, it is necessary to increase the current of the differential circuit. This, however, increases the number of input fan-ins. In order to drive many loads, after all it is obliged to connect a plurality of buffers of differential pairs in successive stages. This increases not only current consumption but also the number of elements. In this manner, the fact that an emitter follower cannot be used imposes a heavy burden in circuit design.

A logic circuit for a low voltage is disclosed in U.S. Pat. No. 4,845,387. The logic circuit is not up-to-date in that it requires a special element such as a Schottky diode. Further, a systematic logic circuit system is disclosed in U.S. Pat. No. 5,289,055. The logic circuit system is characterized in that it operates at a comparatively high speed when the load is low.

However, since the logic circuit system uses two sets of logic levels in its essential part, the circuit operates substantially in single operation. Accordingly, in order to assure a DC margin of a signal, the logic amplitude must be set greater than that of a differential circuit. This is disadvantageous in speed and also in lowering of a power supply voltage. In a circuit wherein the logic circuit system is used for a latch, a rising/falling waveform or phase displacement of a differential signal of a clock has a significant influence on the latch characteristic. Therefore, the circuit is inferior in repeatability of operation and cannot be used readily as a component of a large scale logic circuit.

SUMMARY OF THE INVENTION

It is an object of the present invention to provide a high-speed logic circuit which has a sufficient load driving capacity even in its operation with a low power supply voltage.

In order to attain the object described above, according to the present invention, there is provided a logic circuit comprising a drive circuit having an output stage of an emitter follower configuration or a source follower configuration, and a folding circuit including a transistor of a diode connection having a first terminal (for example, the emitter or the source) connected to an emitter follower output terminal or source follower output terminal of the drive circuit and a second terminal (for example, the collector or the drain) connected to a power supply line through a resistor.

In the logic circuit, the folding circuit in which the transistor of a diode connection is used is provided in the next stage to the differential circuit whose output stage has the emitter follower configuration (or source follower configuration) The transistor of a diode connection (the diode of the logic level) acts to raise the signal level of the emitter follower output (or source follower output) by a voltage corresponding to a voltage between the base and the emitter (or between the gate and the source) of the transistor. In this instance, since both of the transistor of the emitter follower (or source follower) and the transistor of a diode connection are normally in an on-state, the folding circuit operates at a very high speed similarly to an ordinary emitter follower (or source follower). Consequently, the logic circuit can operate at a very high speed with a sufficient load driving capacity even in operation with a low power supply voltage.

BRIEF DESCRIPTION OF THE DRAWINGS

FIG. 13 is a circuit diagram showing a basic configuration of a differential circuit;

FIG. 14 is a circuit diagram showing a differential circuit having an emitter follower configuration at an output stage thereof;

DESCRIPTION OF THE PREFERRED EMBODIMENTS

In the following, several embodiments of the present invention are described with reference to the accompanying drawings. It is to be noted that, in the embodiments described below, a bipolar transistor is used for all of component transistors.

Figure 1:
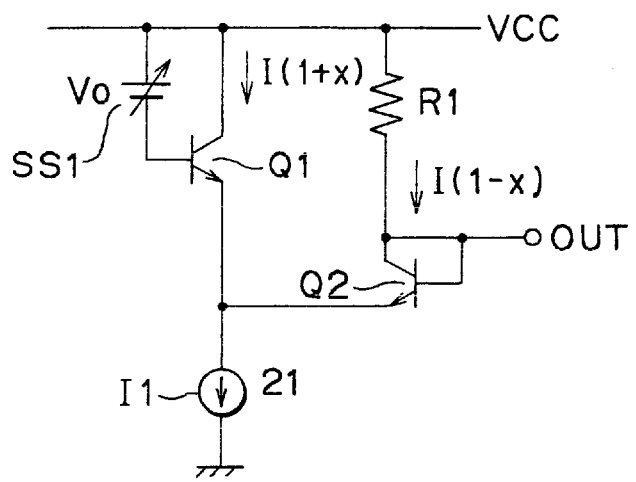
FIG. 1 is a circuit diagram showing a basic circuit configuration of a logic circuit according to a first embodiment of the present invention.

FIG. 1 shows a basic circuit configuration of a logic circuit according to a first embodiment of the present invention. Referring to FIG. 1, an NPN transistor Q1 and a current source I1 are connected in series between a power supply line of a power supply voltage VCC and the ground. A signal voltage V0 from a signal source SS1 is supplied between the collector and the base of the NPN transistor Q1. A resistor R1 and an NPN transistor Q2 of a diode connection (wherein the base and the collector are connected directly to each other) are connected in series between the power supply line and the emitter of the NPN transistor Q1.

The circuit of the configuration described above is used to raise the signal level by means of the NPN transistor Q2 of a diode connection. In the following description, the circuit is called folding circuit. The folding circuit is characterized in that it can operate at a very high speed because the transistors Q1 and Q2 are normally in an on-state, and operates very similarly to an ordinary emitter follower.

Here, the characteristic of the folding circuit of the configuration described above is analyzed. Since the power supply voltage VCC and the emitter voltage are common, where an unknown is represented by x, the current value of the current source I1 by 2I, the signal voltage of the signal source SS1 by V0 and the resistance value of the resistor R1 by R, the following expression is satisfied:

$$Vt\, ln\{I(1+x)/Is1\}+V0=Vt\, ln\{I1(1-x)/Is2\}+RI(1-x) \quad (9)$$

where Vt is the threshold voltage for the transistors Q1 and Q2, and Is1 and Is2 are the saturation currents of the transistors Q1 and Q2, respectively.

By modifying the expression (9), $$ln\{(1+x)/(1-x)\}=[\{RI(1-x)-V0\}/Vt]-ln(Is2/Is1) \quad (10)$$

is determined.

Since the left side is a function only of x and includes no circuit parameter and the right side is a linear expression (here, called load line), the expression is suitable for the graphical approach. The logarithmic function of the left side is $-\infty$ when x=$-1$ and $\infty$ when x=1 and exhibits a monotone increase within the range of x=($-1$, 1). Since the load line has negative slope, the logarithmic function and the load line intersect each other only at one point. x at the intersecting point determines a current distribution.

Here, if it is assumed that the transistors Q1 and Q2 have an equal size, then Is2=Is1, and consequently, the second term of the expression (10) is zero. If the transistors Q1 and Q2 have different transistor sizes from each other, then it is considered that an offset occurs with the signal voltage V0, and only it is required to displace the load line by an amount corresponding to the offset. Therefore, in the following argument, the second term of the expression (10) is ignored.

Figure 2:
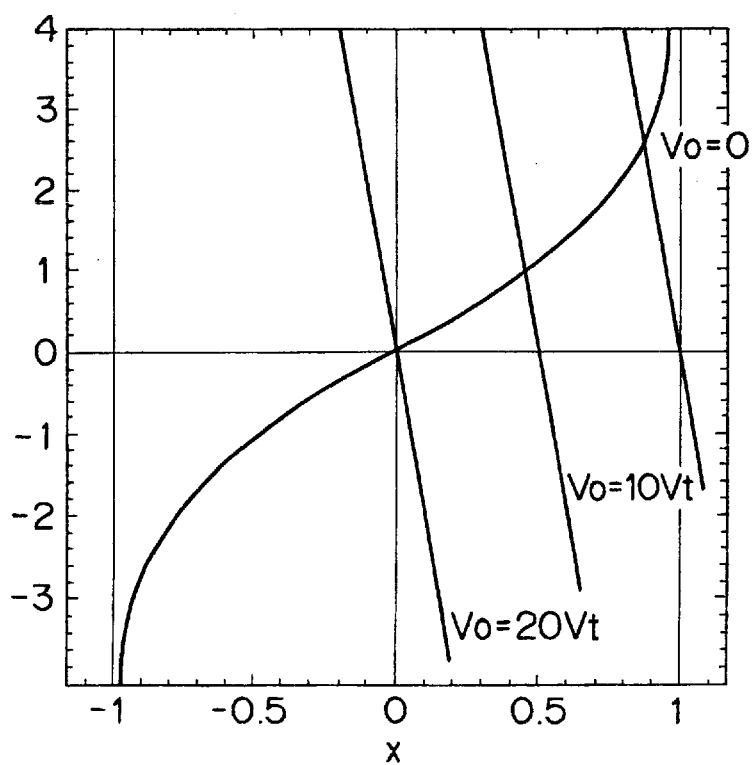
FIG. 2 is a characteristic diagram showing a load line of a folding circuit.

An example of determination of an operating point is illustrated in FIG. 2. In FIG. 2, three load lines are drawn wherein RI/Vt=20 and V0 is 0, 10 and 20 as a ratio to Vt. From the form of the expression (10), the signal voltage V0 can be normalized with the threshold voltage Vt. The threshold voltage Vt is Vt=26 mV or so at the room temperature, and this corresponds to a voltage in the case of R=10.4 k$\Omega$ where 2I=100 $\mu$A.

Further, since x varies from 0.87 to 0.45 in response to a variation of V0=10 Vt=260 mV, the voltage V1 across the resistor R1 varies a little under 220 mV with 20 Vt(0.87–0.45). In this instance, the logic circuit transmits an amplitude equal to 0.8 times the input amplitude. The numerical value examples given above are typical values where a recent bipolar process is used.

Figure 3:
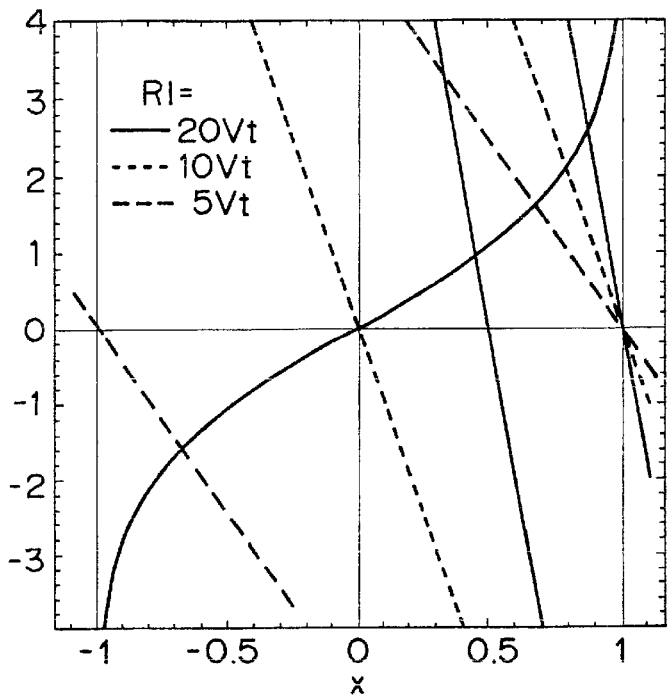
FIG. 3 is a similar view but showing a load line of the folding circuit when the load is varied.

A characteristic variation when RI/VT is changed is illustrated in FIG. 3. In FIG. 3, load lines where V0=0 and V0=10 Vt for different three values of RI=5 Vt, 10 Vt and 20 Vt are shown. It can be gathered from the graph that, for example, where V1 (=RI)=5 Vt, x swings to an excessively low value, and it is supposed that the frequency characteristic of the NPN transistor Q1 as an emitter follower may suffer from deterioration.

Since generally an increasing amount of current flows to the NPN transistor Q1 as x approaches 1, the AC characteristic of the NPN transistor Q1 as an emitter follower is better. Therefore, x should be set to a value as high as possible. To this end, however, RI must be set to a high value. If the current value I is increased, then current consumption increases, but if the resistance value R is increased, then the operating speed is decreased by a parasitic capacitance originating from the resistor. The value of x of the solution does not proportionally exhibit a great increase from the form of the left side of the expression (10).

Although the optimum solution differs depending upon the element to be used or the layout, generally it is considered better to design the logic circuit such that the maximum value of V0 equals to RI, and the value is around 8 Vt to 10 Vt. With the design, since the logic circuit operates always within a non-negative range of x, the transistor Q1 operates at a high speed, and since the solution when V0=0 comes around x=0.8 at which the left side of the expression (10) begins to increase steeply, that is, within a range within which the solution is insensitive to the swing of RI/Vt, also the decrease of the amplitude can be suppressed to the minimum.

Figure 4:
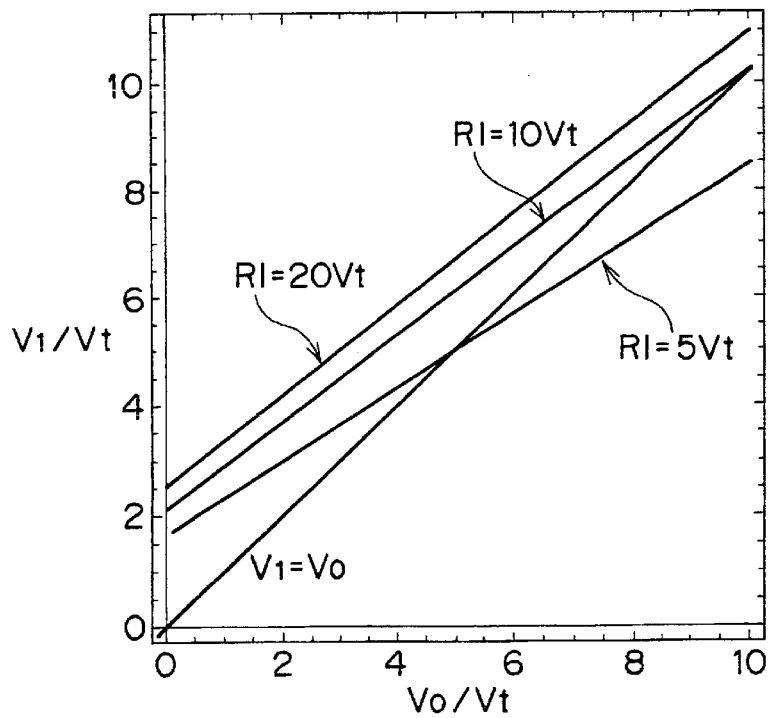
FIG. 4 is a V0–V1 characteristic diagram when the load is varied.

A graph of a load line is convenient for inference of a characteristic of a folding circuit. However, since is refers to current with x, the voltage amplitude represented by V1=RI (1-x) cannot be observed well. Therefore, for reference, a graph obtained by plotting the voltage V1 across the resistor R1 in accordance with the conditions of FIG. 3 is shown in FIG. 4. A solution curve is an almost straight line and intersects at RI =V0 with a straight line of V1=VO. Since the y-intercept can be determined simply descriptively from FIG. 2, drawing of a proximate straight line is easy.

The precise AC characteristic of the folding circuit must be determined strictly through a simulation. However, within a range with which the emitter resistance of the NPN transistor Q2 is enough lower than the resistance value R of the resistor R1, the folding circuit is considered to be a parallel load of the parasitic capacitance of the emitter of the NPN transistor Q2 and the resistor R1.

A similar idea applies also where two or more loads are driven by the folding circuit. Particularly where two equivalent loads, that is, two NPN transistor Q2 and two resistor R1, are connected in parallel, if also two NPN transistors Q1 are connected in parallel to keep symmetry, then this is equivalent to mere reduction of the resistance value R of the resistor R1 to ½. It is to be noted that, even if the size of the NPN transistor Q1 is not adjusted, this results in a little displacement of the voltage. It is not a good strategy to use a folding circuit to drive an excessively great number of loads because this results in significant deterioration of the performance.

Subsequently, particular working examples of the present invention which uses the logic circuit according to the first embodiment having the configuration described above, that is, the folding circuit, is described. Transistors used in the working examples are all NPN transistors, and in the following description, an NPN transistor is merely referred to as transistor.

Figure 5:
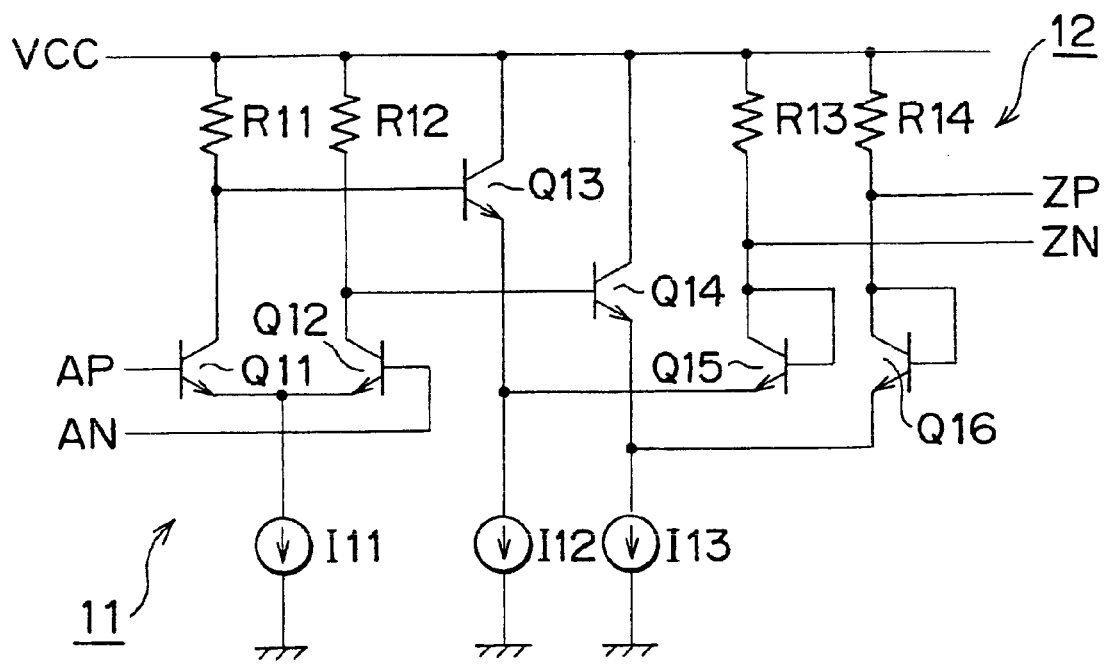
FIG. 5 is a circuit diagram showing a logic circuit according to a first working example of the first embodiment of the present invention.

FIG. 5 shows a logic circuit used as a driver circuit according to a first working example of the first embodiment of the present invention. Referring to FIG. 5, the driver circuit shown includes a differential circuit 11 whose output stage is an emitter follower, and a folding circuit 12 which raises the signal level of differential outputs of the differential circuit 11, differentially extracting the differential outputs of the raised signal levels and supplying the extracted differential outputs to a logic circuit (not shown) in the next stage.

The differential circuit 11 includes differential pair transistors Q11 and Q12 whose emitters are connected commonly, a current source I11 connected between the emitter common connecting point of the transistors Q11 and Q12 and the ground, and a pair of resistors R11 and R12 connected between the collectors of the differential pair transistors Q11 and Q12 and a power supply line (power supply voltage VCC).

The output stage of the differential circuit 11 is formed from an emitter follower including transistors Q13 and Q14 whose bases are connected to the collectors of the differential transistors Q11 and Q12, respectively, and whose collectors are connected to the power supply line, and current source I12 and I13 connected between the emitters of the transistors Q13 and Q14 and the ground.

The folding circuit 12 includes a pair of transistors Q15 and Q16 of a diode connection whose emitters are connected to the emitters of the transistors Q13 and Q14, respectively, and a pair of resistors R13 and R14 connected between the collectors (bases) of the transistors Q15 and Q16 and the power supply line, respectively, and derives differential outputs from the collectors of the transistors Q15 and Q16.

When the driver circuit according to the first working example having the configuration described above is used, preferably the transistors Q11 to Q14 of the differential circuit 11 are arranged in the proximity of each other and the folding circuit 12 is arranged in the proximity of the logic circuit in the next stage. If emitter currents of the transistors Q13 and Q14 are set to high values, then a parasitic capacitance appearing between the emitters of the transistors Q13 and Q14 originating from a transmission system between the differential circuit 11 and the folding circuit 12 can be canceled.

When the power supply voltage VCC is sufficiently high, a configuration wherein the outputs are extracted also from the emitters of the transistors Q15 and Q16 can be taken. Consequently, in a case wherein such a plurality of circuits of a series gating as shown in FIG. 13 are driven, the configuration described above can be used in such a manner that a load of the level of the A system is driven with the outputs ZP/ZN and a load of the level of the B system is driven by the emitter side. The connection configuration just described is useful when a complicated encode circuit is designed.

Since the folding circuit 12 which uses the transistors Q15 and Q16 of a diode connection is provided in the next stage to the differential circuit 11 of the configuration wherein the emitter follower Q13 and Q14 is used on the output stage so that the signal level of the differential outputs is raised as described above, since the folding circuit 12 operates very similarly to an emitter follower which operates at a very high speed, a high-speed driver circuit having a load driving capacity even when it operates with a low power supply voltage can be realized as apparently recognized from the foregoing description.

Subsequently, a working example of a logic circuit which can be suitably used as an OR circuit or an exclusive OR circuit (hereinafter referred to as XOR circuit) is described. The configuration of an OR circuit can be generalized. Generally, logic OR by a wired OR connection can be used on the emitter side of a folding circuit, and logic AND by a collector dotting can be used on the collector side.

Therefore, a logic formula where OR terms are coupled with AND can be realized as it is. This form is called a standard product form, and any logic formula can be realized in this form. A standard product form is disclosed in William E.Wickes (Logic Design with Integrated Circuits, John Wiley & Sons, Inc. 1968).

SECOND WORKING EXAMPLE

Figure 6:
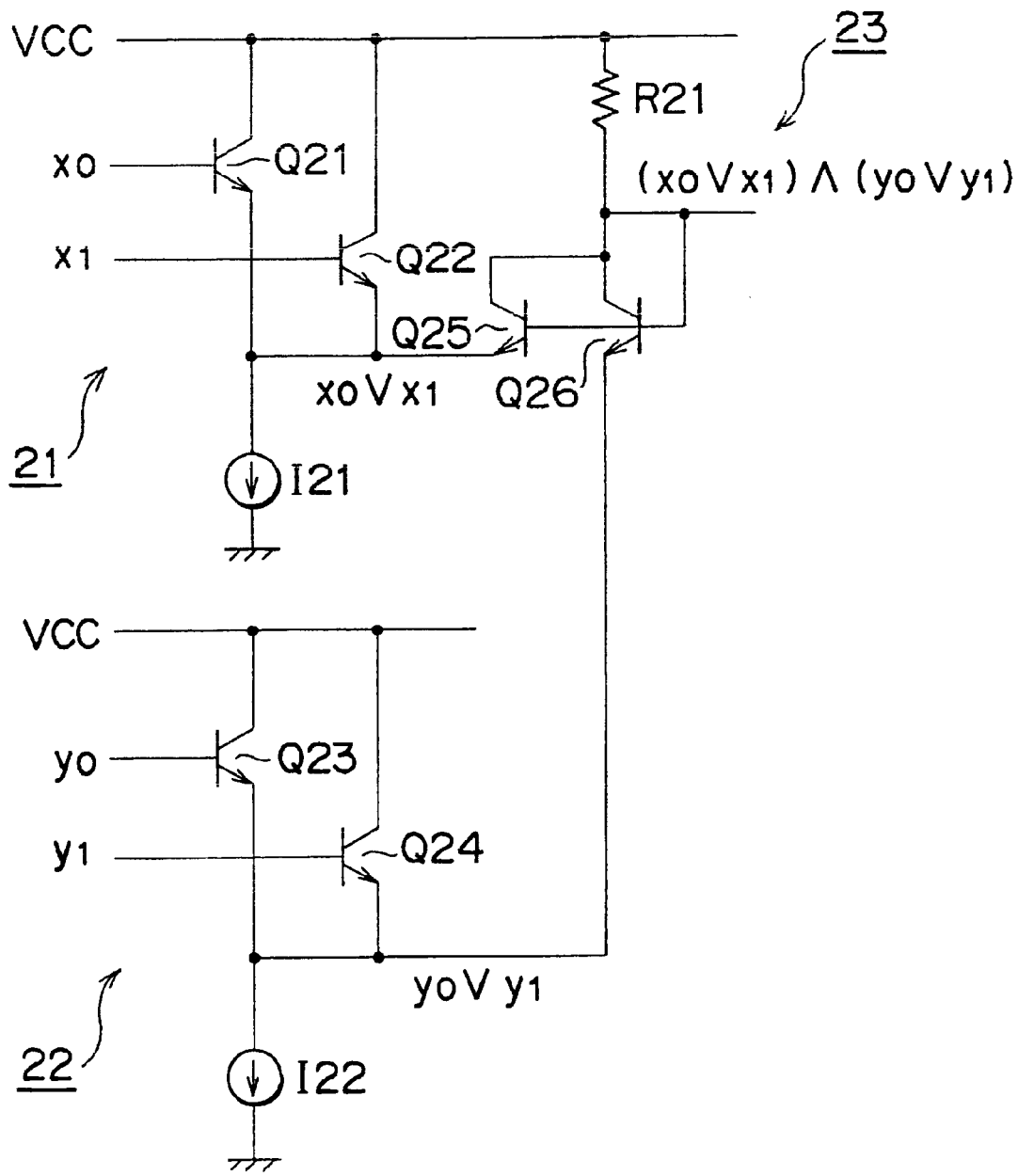
FIG. 6 is a circuit diagram showing a basic form of a logic circuit according to a second working example of the first embodiment of the present invention.

FIG. 6 shows a generalized logic circuit according to a second working example of the first embodiment of the present invention which adopts a standard product form. Referring to FIG. 6, the logic circuit shown includes, for example, two emitter follower circuits 21 and 22 and a folding circuit 23 which performs logic arithmetic operation of outputs of the emitter follower circuits 21 and 22.

The emitter follower circuit 21 includes emitter follower transistors Q21 and Q22 whose emitters are connected commonly (wired OR connection) and a current source I21 connected between the emitter common connecting point of the transistors Q21 and Q22 and the ground. Also the emitter follower circuit 22 includes, similarly to the emitter follower circuit 21, emitter follower transistors Q23 and Q24 whose emitters are connected in wired OR connection and a current source I22 connected between the emitter common connecting point of the transistors Q23 and Q24 and the ground.

The folding circuit 23 includes a transistor Q25 of a diode connection whose emitter is connected to the emitters of the transistors Q21 and Q22, another transistor Q26 of a diode connection whose emitter is connected to the emitters of the transistors Q23 and Q24, and a resistor R21 connected between the collectors of the transistors Q25 and Q26 and the power supply line.

In the logic circuit according to the second working example described above, when base inputs of the transistors Q21 and Q22 are represented by x0 and x1 and base inputs of the transistors Q23 and Q24 by y0 and y1, respectively, a logic arithmetic operation given by $$(x0 \vee x1) \wedge (y0 \vee y1) \tag{11}$$

can be realized.

A method of producing the standard product form is known already. In particular, the standard product form can be produced by selecting a row of a truth table which exhibits the value 0, inverting the inputs whose input is 1 while the term whose input is 0 is left as it is and logic ORing the all these values. Further, actually the number of terms can be reduced by simplifying the logic. In the following, particular forms of the logic circuit according to the second working example which adopt the standard product form are described.

An OR logic is shown as a first particular form. First, a truth table of the OR logic is given in Table 1 below.

TABLE 1

| A | B | OR | !OR |
|---|---|----|----|
| 0 | 0 | 0 | 1 |
| 0 | 1 | 1 | 0 |
| 1 | 0 | 1 | 0 |
| 1 | 1 | 1 | 0 |

From Table 1 above, the standard product form is determined as:

$$OR = A \vee B \tag{12}$$

$$!OR = (A \vee !B) \wedge (!A \vee B) \wedge (!A \vee !B) \tag{13}$$

$$= (A \vee !B) \wedge !A$$

$$= !B \wedge !A$$

Figure 7:
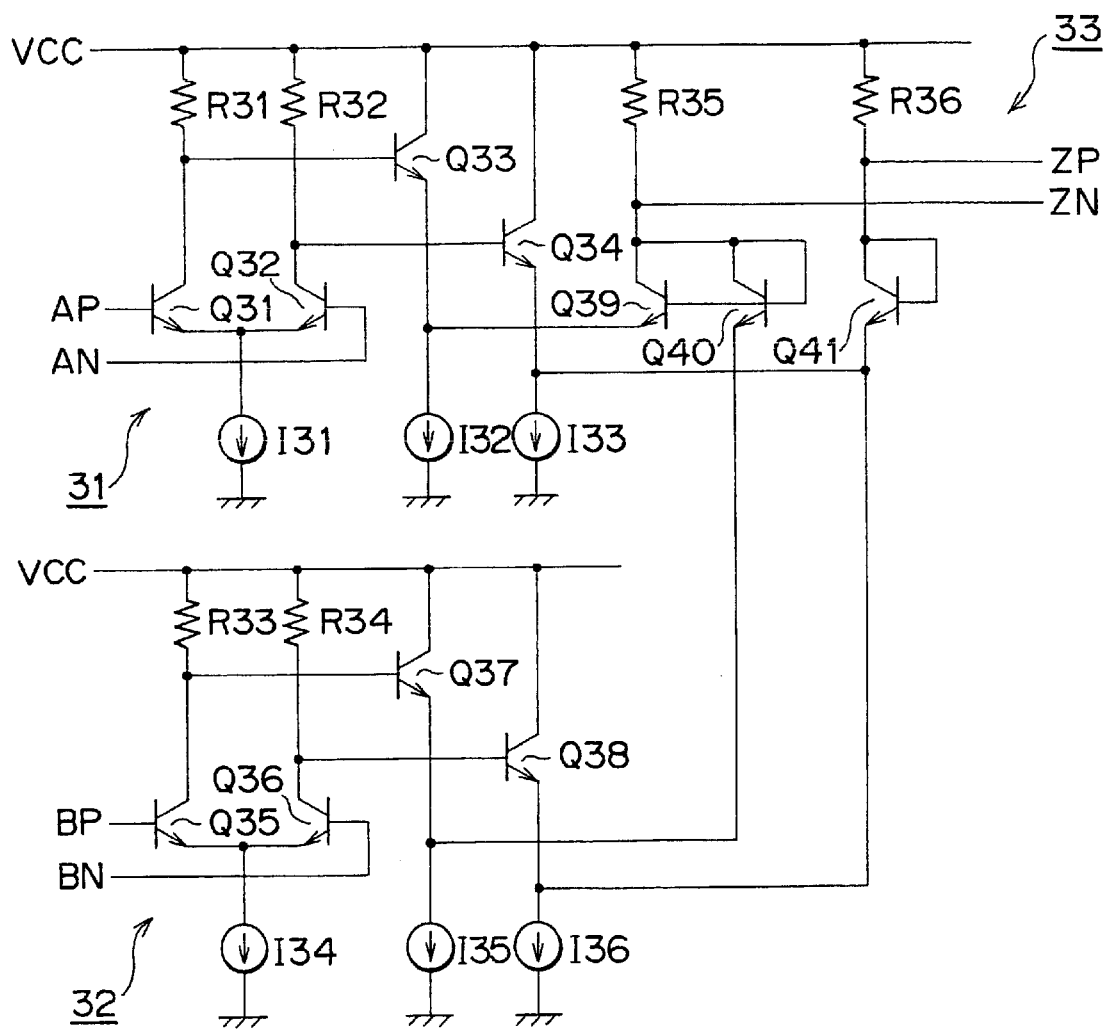
FIG. 7 is a circuit diagram showing a first form of the logic circuit according to the second working example.

The OR circuit of the first particular form of the logic circuit according to the second working example implements the expressions given above. An example of the circuit is shown in FIG. 7. Referring to FIG. 7, the OR circuit shown includes, for example, two differential circuits 31 and 32 whose output stage has an emitter follower configuration, and a folding circuit 33 which logicly ORs differential outputs of the differential circuit 31 and 32.

The differential circuit 31 includes a basic circuit which includes differential pair transistors Q31 and Q32 whose emitters are connected commonly, a current source I31 connected between the emitter common connecting point of the transistors Q31 and Q32 and the ground, and a pair of resistors R31 and R32 connected between the collectors of the differential pair transistors Q31 and Q32 and a power supply line of the power supply voltage VCC.

The output stage of the differential circuit 31 is configured from an emitter follower formed from a pair of transistors Q33 and Q34 whose bases are connected to the collectors of the differential pair transistors Q31 and Q32, respectively, and whose collectors are connected to the power supply line, and a pair of current sources I32 and I33 connected between the emitters of the transistors Q33 and Q34 and the ground, respectively.

Also the differential circuit 32 includes, similarly to the differential circuit 31, a basic circuit which includes differential pair transistors Q35 and Q36, a current source I34 and a pair of resistors R33 and R34, and an output stage which includes a pair of transistors Q37 and Q38 of an emitter follower, and a pair of current sources I35 and I36.

The folding circuit 33 includes a pair of transistors Q39 and Q40 of a diode connection whose emitters are connected to the emitters of the transistors Q33 and Q37, respectively, a transistor Q41 of a diode connection whose emitter is connected to the emitters of the transistors Q34 and Q38, a resistor R35 connected between the collectors (bases) of the transistors Q39 and Q40 and the power supply line, and another resistor R36 connected between the collector of the transistor Q41 and the power supply line.

In the OR circuit according to the first form having the configuration described above, the transistors Q34 and Q38 are used in a wired OR connection wherein the emitters of them are connected commonly and the transistors Q39 and 40 are used in a collector dotting connection wherein the collectors of them are connected commonly to realize a differential OR/NOR circuit. In this instance, since only one current source is required for the wired OR connection, one of the current sources I33 and I36 may be omitted.

Since the transistor Q34 and the transistor Q38 are used in a wired OR connection while the transistor Q39 and the transistor Q40 are used in a collector dotting connection as described above and the signal levels of the logic outputs are raised by the folding circuit 33, the amplitude does not vary by a great amount and the low level does not lower excessively, and therefore, a high speed operation can be achieved with a low power supply voltage.

It is to be noted that, based on the De Morgan theorem of the expression (2) given hereinabove, the circuit shown in FIG. 7 can be regarded as a differential AND circuit only by changing the interpretation of the logic values. By the way, from the theorem that "any logic function can be realized with a combination of AND, OR and NOT", any logic function can be realized with the folding circuit shown in FIG. 1. Further, while the present working example is described by way of an example which uses two inputs, apparently a multiple-input OR circuit or AND circuit can be realized similarly.

An XOR circuit is described as a second form of the second working example. First, a truth table of the XOR circuit is given in Table 2 below:

TABLE 2

| A | B | XOR | !XOR |
|---|---|-----|------|
| 0 | 0 | 0 | 1 |
| 0 | 1 | 1 | 0 |
| 1 | 0 | 1 | 0 |
| 1 | 1 | 0 | 1 |

In order to determine the standard product form, attention is paid to rows wherein the output is 0. Then, by ORing inverted values of the input conditions of them, $$XOR = (A \vee !B) \vee (!A \vee !B) \tag{14}$$

is obtained for the XOR output, and $$!XOR = (A \vee !B) \wedge (!A \vee B) \tag{15}$$

is obtained for the !XOR. In this instance, neither of the two expressions can be simplified.

Figure 8:
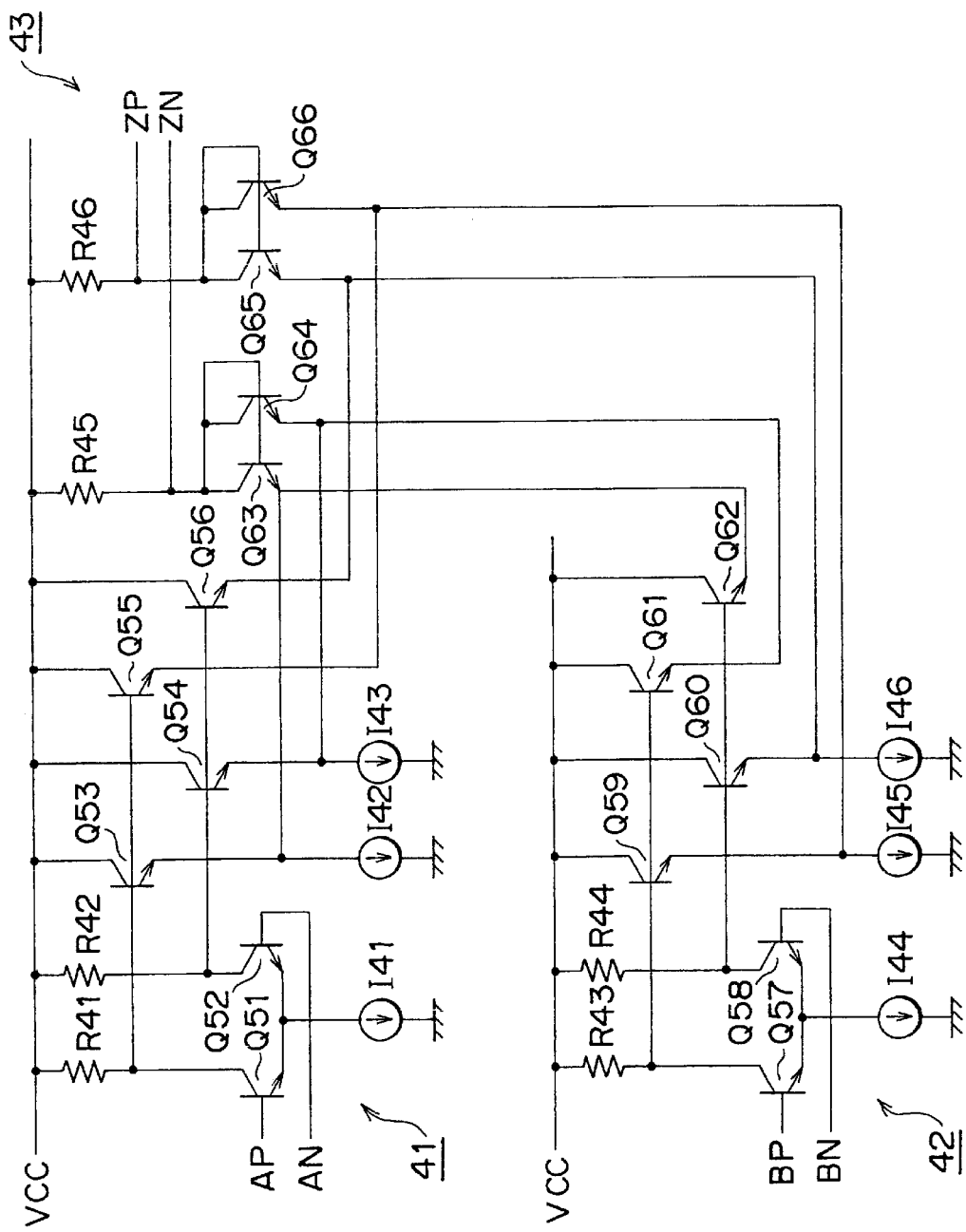
FIG. 8 is a circuit diagram showing a second form of the logic circuit according to the second working example.

This is realized by the XOR circuit which is the second form of the logic circuit according to the second working example, and an example of the circuit is shown in FIG. 8. Referring to FIG. 8, the XOR circuit shown includes, for example, two differential circuits 41 and 42 whose output stage has an emitter follower configuration, and a folding XOR circuit 43 for exclusively ORing differential outputs of the differential circuits 41 and 42.

The differential circuit 41 includes a basic circuit which in turn includes differential pair transistors Q51 and Q52 whose emitters are connected commonly, a current source I41 connected between the emitter common connecting point of the differential pair transistors Q51 and Q52 and the ground, and a pair of resistors R41 and R42 connected between the collectors of the differential pair transistors Q51 and Q52 and a power supply line of a power supply voltage VCC The differential circuit 41 further includes an output stage which in turn includes a pair of transistors Q53 and Q54 whose bases are connected to the collectors of the differential pair transistors Q51 and Q52, respectively, and whose collectors are connected to the power supply line, a pair of current sources I42 and I43 connected between the emitters of the transistors Q53 and Q54 and the ground, respectively, and a pair of transistors Q55 and Q56 whose bases are connected to the collectors of the differential pair transistors Q51 and Q52, respectively, and whose collectors are connected to the power supply line.

Also the differential circuit 42 includes, similarly to the differential circuit 41, a basic circuit which includes differential pair transistors Q57 and Q58, a current source I44, and a pair of resistors R43 and R44, and an output stage which includes transistors Q59 to Q62 of an emitter follower, and a pair of current sources I45 and I46.

The folding XOR circuit 43 includes a transistor Q63 of a diode connection whose emitter is connected to the emitters of the transistors Q55 and Q62, another transistor Q64 of a diode connection whose emitter is connected to the emitters of the transistors Q54 and Q61, a further transistor Q65 of a diode connection whose emitter is connected to the emitters of the transistors Q56 and Q60, a still further transistor Q66 of a diode connection whose emitter is connected to the emitters of the transistor Q55 and Q59, a resistor R45 connected between the collectors of the transistors Q63 and Q64 and the power supply line, and another resistor R46 connected between the collectors of the transistors Q65 and Q66 and the power supply line.

In the XOR circuit according to the second form having the configuration described above, the transistors Q53 and Q62, the transistors Q54 and Q61, the transistors Q55 and Q59 and the transistors Q56 and Q60 are used in a wired OR connection and the transistors Q63 and Q64 and the transistors Q65 and Q66 are used in a collector dotting connection to realize a differential XOR circuit.

It is to be noted that, while the present form is described by way of an example which uses two inputs, where multiple inputs are involved, wired OR results of a combination by which the logic true is provided and another combination by which the logic false is provided may be connected in collector dotting connection.

Figure 9:
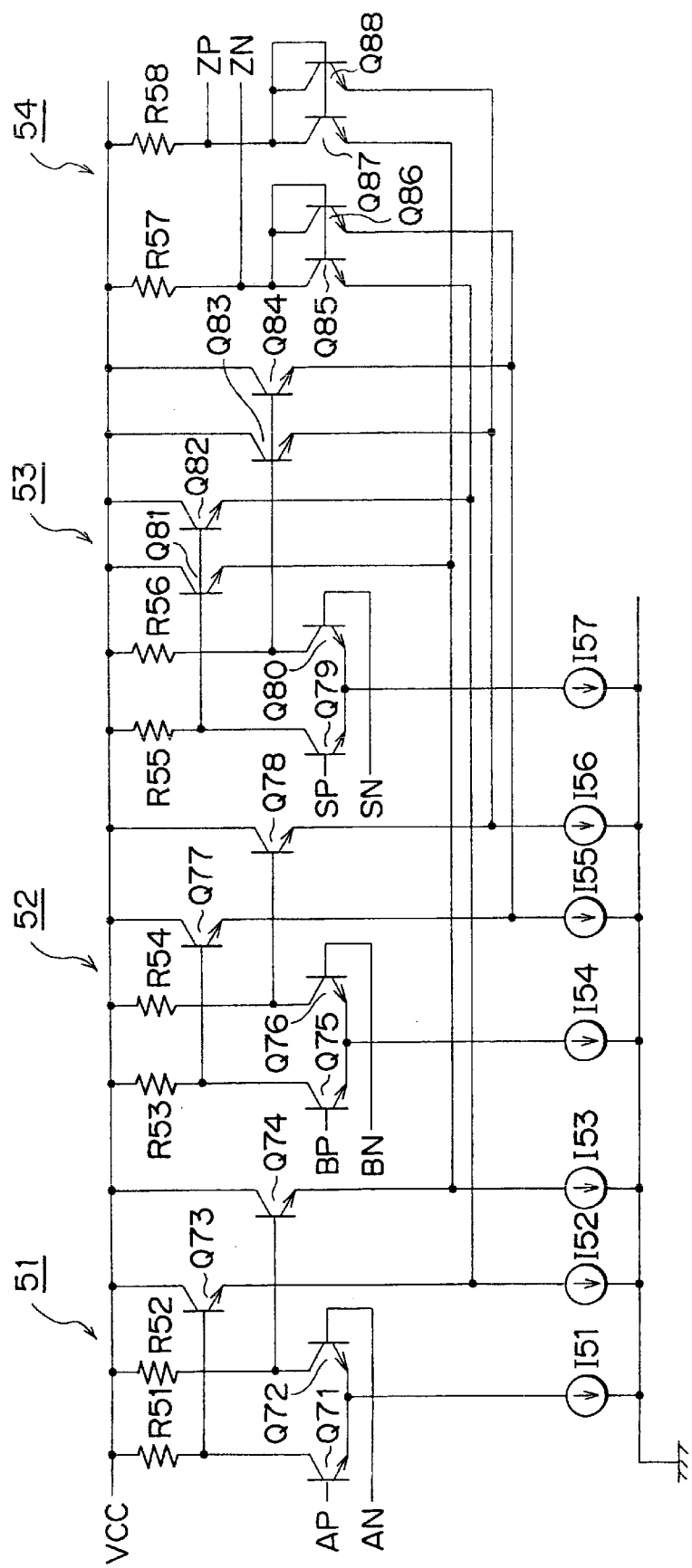
FIG. 9 is a circuit diagram showing a logic circuit according to a third working example of the first embodiment of the present invention.

FIG. 9 shows a logic circuit according to a third working example of the first embodiment of the present invention which is used as a selector circuit. Referring to FIG. 9, the selector circuit shown includes, for example, two differential circuits 51 and 52 whose output stages have an emitter follower configuration, a differential circuit (selector circuit) 53 which operates in response to a logic value (high/low) of a select signal SP/SN and whose output stage has an emitter follower configuration, and a folding circuit 54 for raising the signal level of selection outputs of the differential circuit 53 and outputting the selection outputs of the raised signal level.

The differential circuit 51 includes a basic circuit which in turn includes differential pair transistors Q71 and Q72 whose emitters are connected commonly, a current source I51 connected between the emitter common connecting point of the differential pair transistors Q71 and Q72 and the ground, and a pair of resistors R51 and R52 connected between the collectors of the differential pair transistors Q71 and Q72 and a power supply line of the power supply voltage VCC, respectively.

The differential circuit 51 further includes an output stage formed from an emitter follower which includes a pair of transistors Q73 and Q74 whose bases are connected to the collectors of the differential pair transistors Q71 and Q72, respectively, and whose collectors are connected to the power supply line, and a pair of current sources I52 and I53 connected between the emitters of the transistors Q73 and Q74 and the ground, respectively.

Also the differential circuit 52 includes, similarly to the differential circuit 51, a basic circuit which includes differential pair transistors Q75 and Q76, a current source I54 and a pair of resistors R53 and R54, and an output stage of an emitter follower which includes a pair of transistors Q77 and Q78 and a pair of current sources I55 and I56.

The differential circuit 53 includes a basic circuit which in turn includes differential pair transistors Q79 and Q80 whose emitters are connected commonly, a current source I57 connected between the emitter common connecting point of the differential pair transistors Q79 and Q80 and the ground, and a pair of resistors R55 and R56 connected between the collectors of the differential pair transistors Q79 and Q80 and a power supply line of a power supply voltage VCc, respectively.

The differential circuit 53 further includes an output stage formed from an emitter follower which includes a pair of transistors Q81 and Q82 whose bases are connected to the collector of the transistor Q79 and whose emitters are connected to the emitters of the transistors Q73 and Q74, respectively, and another pair of transistors Q83 and Q84 whose bases are connected to the collector of the transistor Q80 and whose emitters are connected to the emitters of the transistors Q77 and Q78, respectively.

The folding circuit 54 includes a transistor Q85 of a diode connection whose emitter is connected to the emitters of the transistor Q73 and Q82, another transistor Q86 of a diode connection whose emitter is connected to the emitters of the transistors Q77 and Q84, a further transistor Q87 of a diode connection whose emitter is connected to the emitters of the transistors Q74 and Q81, a still further transistor Q88 of a diode connection whose emitter is connected to the emitters of the transistors Q78 and Q83, a resistor R57 connected between the collectors of the transistors Q85 and Q86 and the power supply line, and another resistor R58 connected between the collectors of the transistors Q87 and Q88 and the power supply line.

In the selector circuit according to the third working example having the configuration described above, the transistors Q73 and Q82, the transistors Q74 and Q81, the transistors Q77 and Q84 and the transistors Q78 and Q83 are used in a wired OR connection and the transistors Q85 and Q86 and the transistors Q87 and Q88 are used in a collector dotting connection to realize a differential selector circuit.

The selector circuit thus switchably outputs the signal AP/AN of the A system of the differential circuit 51 side or the signal BP/BN of the B system of the differential circuit 52 side in response to the logic value (high/low) of the select signal SP/SN which is differential inputs to the differential pair transistors Q79 and Q80 of the differential circuit 53. While the present working example is described by way of an example which uses two inputs, it can be applied similarly also where multiple inputs are used.

Figure 10:
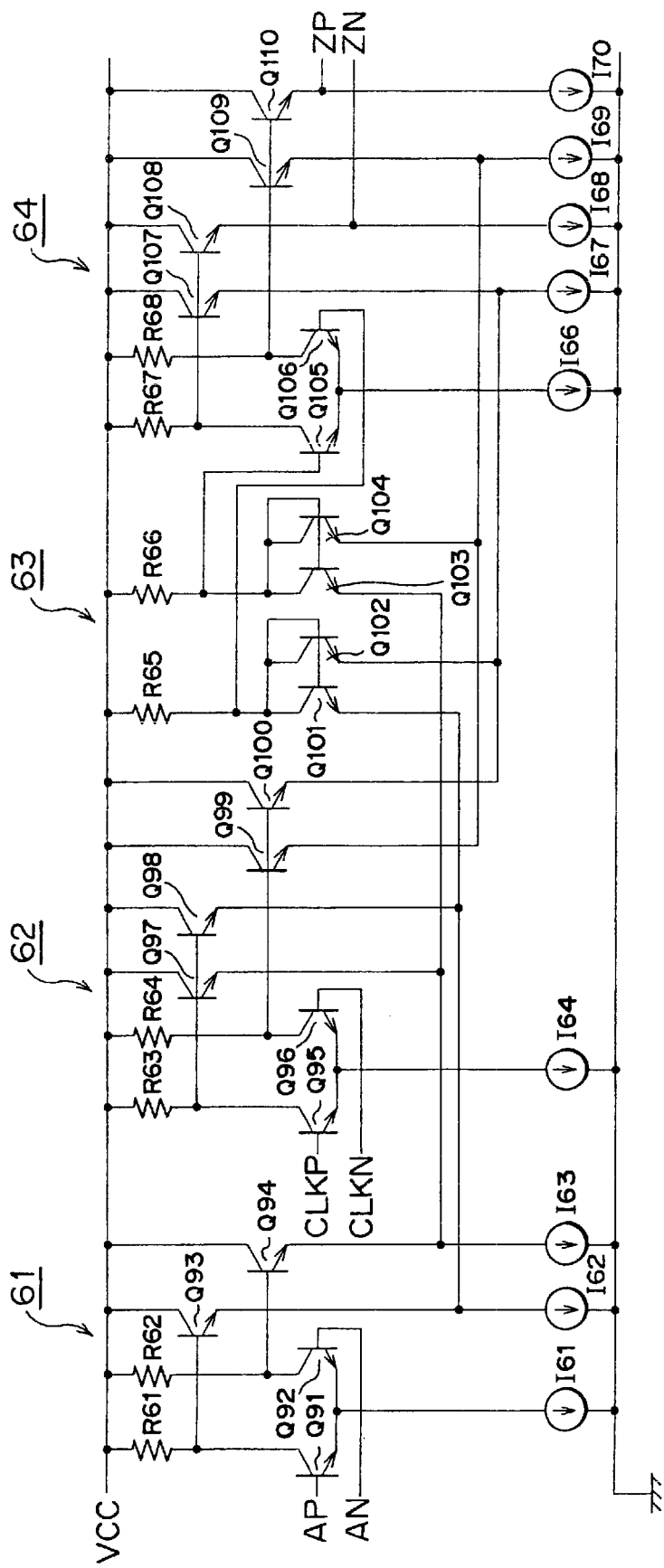
FIG. 10 is a circuit diagram showing a logic circuit according to a fourth working example of the first embodiment of the present invention.

FIG. 10 shows a logic circuit according to the fourth working example of the first embodiment of the present invention which is used as a latch circuit. Referring to FIG. 10, the latch circuit shown includes a differential circuit 61 which serves as an input stage, another differential circuit 62 which operates in response to a clock signal CLKP/CLKN, a folding circuit 63 for raising the signal level, and a further differential circuit 64 which operates as a latch. The output stage of each of the differential circuits 61, 62 and 64 has an emitter follower configuration.

In particular, the differential circuit 61 includes a basic circuit which in turn includes differential pair transistors Q91 and Q92 whose emitters are connected commonly, a current source I61 connected between the emitter common connecting point of the differential pair transistors Q91 and Q92 and the ground, and a pair of resistors R61 and R62 connected between the collectors of the differential pair transistors Q91 and Q92 and a power supply line of a power supply voltage VCC, respectively.

The differential circuit 61 further includes an output stage formed from an emitter follower which includes a pair of transistors Q93 and Q94 whose bases are connected to the collectors of the differential pair transistors Q91 and Q92, respectively, and whose collectors are connected to the power supply line, and a pair of current sources I62 and I63 connected between the emitters of the transistors Q93 and Q94 and the ground, respectively.

Similarly to the differential circuit 61, the differential circuit 62 includes a basic circuit which in turn includes differential pair transistors Q95 and Q96, a current source I64 and a pair of resistors R63 and R64. The differential circuit 62 further includes an output stage formed from an emitter follower which includes a pair of transistors Q97 and Q98 whose bases are connected to the collector of the transistor Q95 and whose emitters are connected to the emitters of the transistors Q93 and Q94, respectively, and another pair of transistors Q99 and Q100 whose bases are connected to the collector of the transistor Q96.

The folding circuit 63 includes a transistor Q101 of a diode connection whose emitter is connected to the emitters of the transistor Q93 and Q98, another transistor Q102 of a diode connection whose emitter is connected to the emitter of the transistor Q100, a further transistor Q103 of a diode connection whose emitter is connected to the emitters of the transistor Q94 and Q97, a still further transistor Q104 of a diode connection whose emitter is connected to the emitter of the transistor Q93, a resistor R65 connected between the collectors of the transistors Q101 and Q102 and the power supply line, and another resistor R66 connected between the collectors of the transistors Q103 and Q104 and the power supply line.

Also the differential circuit 64 includes, similarly to the differential circuits 61 and 62, a basic circuit which in turn includes differential pair transistors Q105 and Q106, a current source I66, and a pair of resistors R67 and R68. The differential circuit 64 further includes an output stage which includes a pair of transistors Q107 and Q108 whose bases are connected to the collector of the transistor Q105, another pair of transistors Q109 and Q110 whose bases are connected to the collector of the transistor Q106, and current sources I67 to I70 connected between the emitters of the transistors Q107 to Q110 and the ground, respectively.

In the output stage of the differential circuit 64, in order to reduce the influence on a latching operation, the differential outputs ZP and ZN are extracted through the emitter follower of the transistors Q108 and Q110. It is to be noted that the logic function is the same whether the outputs are extracted from the opposite terminals of the resistors R65 and R66 or from the other opposite terminals of the resistors R67 and R68.

In the latch circuit according to the fourth working example having the configuration described above, the transistors Q93 and Q98, the transistors Q94 and Q97, the transistors Q99 and Q109 and the transistors Q100 and Q107 are used in a wired OR connection and the transistors Q101 and Q102 and the transistors Q103 and Q104 are used in a collector dotting connection to realize a differential latch circuit.

As described in connection with the first to fourth working examples of the first embodiment, by applying a folding circuit which uses a diode, an arbitrary logic circuit which operates with a low power supply voltage can be realized without sacrificing the high speed operation. The high speed operation is effective even where the power supply voltage is sufficiently high.

Further, since the logic circuit according to any of the working examples described above has a basically differential configuration, the logic amplitude can be reduced to its limit. Accordingly, a high speed operation and a lower power supply voltage which approach their limits can be anticipated. Besides, since only NPN transistors are used, the intended object can be achieved without using high speed PNP transistors or other special elements.

Figure 11:
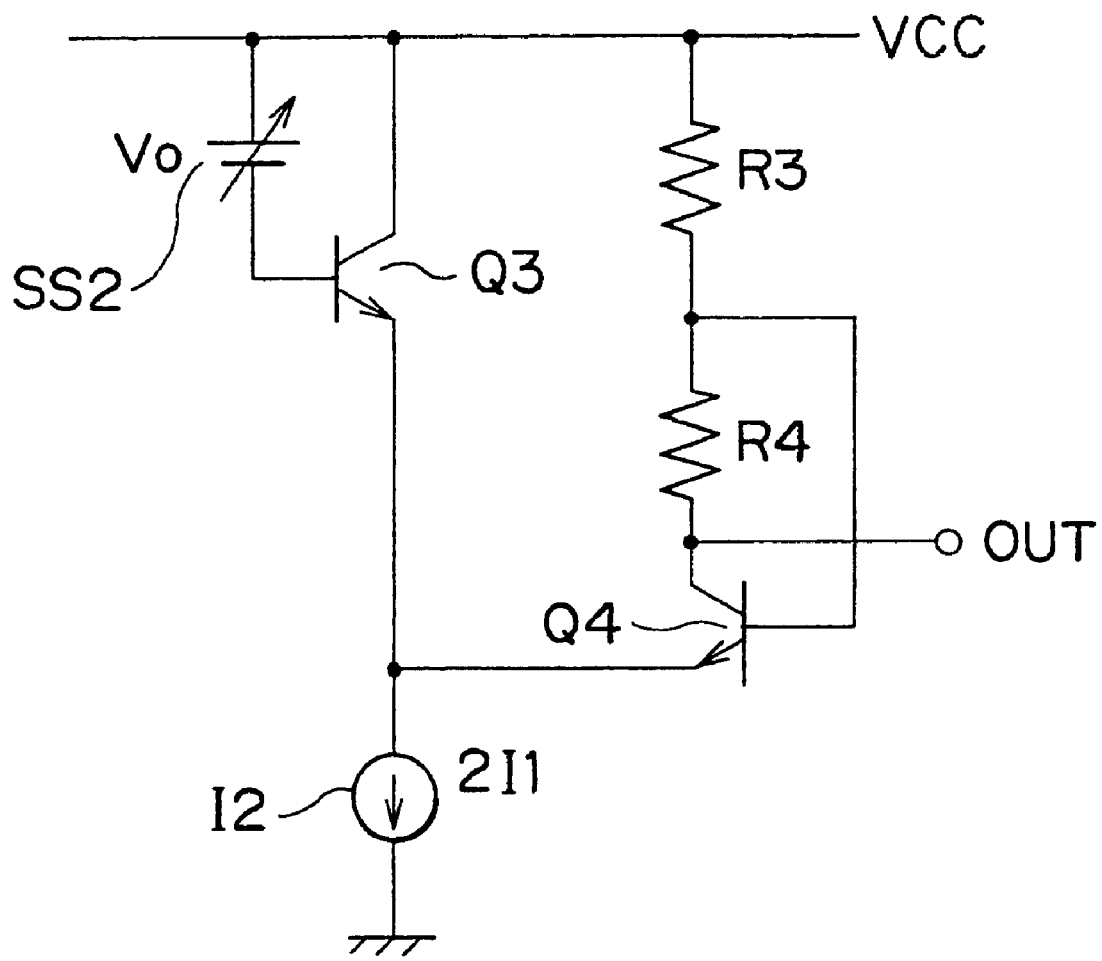
FIG. 11 is a circuit diagram showing a basic circuit configuration of a logic circuit according to a second embodiment of the present invention.

FIG. 11 shows a basic circuit configuration of a logic circuit according to a second embodiment of the present invention. Referring to FIG. 11, the logic circuit shown includes an NPN transistor Q3 and a current source I2 connected in series between a power supply line of a power supply voltage VCC and the ground. A signal voltage V0 from a signal source SS2 is applied between the collector and the base of the NPN transistor Q3.

A resistor R3, another resistor R4 and an NPN transistor Q4 are connected in series between the power supply line and the emitter of the NPN transistor Q3. The base of the NPN transistor Q4 is connected to a common connecting point of the resistors R3 and R4. An output of the logic circuit is derived from the collector of the NPN transistor Q4.

The logic circuit according to the second embodiment is a level shift amplitude amplification circuit for compensating for a drop of the amplitude of the logic circuit according to the first embodiment described hereinabove. The logic circuit is practically used in a differential form similarly to the logic circuit according to the first working example (refer to FIG. 5) and the logic circuits according to the other working examples described hereinabove.

In the logic circuit according to the second embodiment having the configuration described above, where the resistance values of the resistors R3 and R4 are represented by Ra and Rb, respectively, then the amplification factor A is given by:

$$A=1+Rb/Ra \tag{16}$$

Consequently, the logic circuit can be used within a range within which the NPN transistor Q4 is not saturated. A falling edge of the output has a through-rate of the series resistance value of Ra+Rb.

Further, the logic circuit according to the second embodiment not only acts to increase the amplitude, but also acts to increase the drop of the high level of the signal from the power supply voltage VCC that is, RI(1−x) of the expression (10) where V0=0, with an equal magnification factor. Accordingly, the logic circuit can be utilized also as a high-speed level shift circuit.

It is to be noted that the logic circuit according to the second embodiment can be used in place of the folding circuit of each of the working examples of the first embodiment, that is, the folding circuit 12 of FIG. 5, the folding circuit 23 of FIG. 6, the folding circuit 33 of FIG. 7, the folding XOR circuit 43 of FIG. 8, the folding circuit 54 of FIG. 9, or the folding circuit 63 of FIG. 10.

Now, a particular working example which uses the logic circuit according to the second embodiment having the configuration described above is described. Here, description is given of an example wherein the logic circuit is applied to a majority circuit which outputs the logic value 1 when the majority of inputs has the logic value 1. A truth table where the majority circuit has three inputs A, B and C is shown in Table 3 below:

TABLE 3

| A | B | C | ZP | ZN |
|---|---|---|----|----|
| 0 | 0 | 0 | 0  | 1  |
| 0 | 0 | 1 | 0  | 1  |
| 0 | 1 | 0 | 0  | 1  |
| 0 | 1 | 1 | 1  | 0  |
| 1 | 0 | 0 | 0  | 1  |
| 1 | 0 | 1 | 1  | 0  |
| 1 | 1 | 0 | 1  | 0  |
| 1 | 1 | 1 | 1  | 0  |

From Table 3 above, $$ZP = (A \vee B \vee C) \wedge (A \vee B \vee !C) \wedge \qquad (17)$$
$$(A \vee !B \vee C) \wedge (!A \vee B \vee C)$$

$$ZN = (A \vee !B \vee !C) \wedge (!A \vee B \vee !C) \wedge \qquad (18)$$
$$(!A \vee !B \vee C) \wedge (!A \vee !B \vee !C)$$

are determined as the standard product form. Both of the expressions (17) and (18) can be simplified respectively to $$ZP = (A \vee B) \wedge (B \vee C) \wedge (C \vee A) \qquad (19)$$

$$ZN = (!B \vee !C) \wedge (!C \vee !A) \wedge (!A \vee !B) \qquad (20)$$

Figure 12:
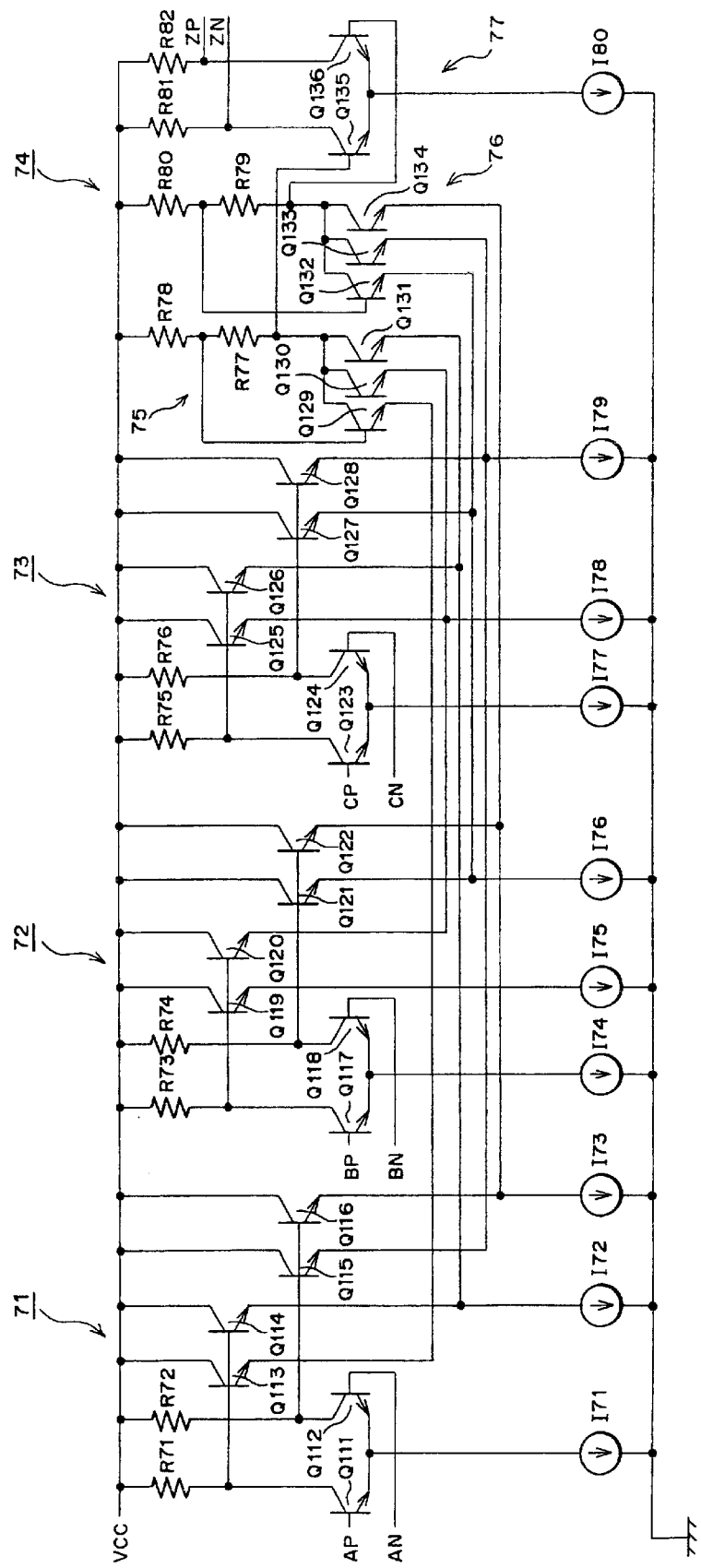
FIG. 12 is a circuit diagram showing a logic circuit according to a particular working example of the second embodiment.
Figure 15:
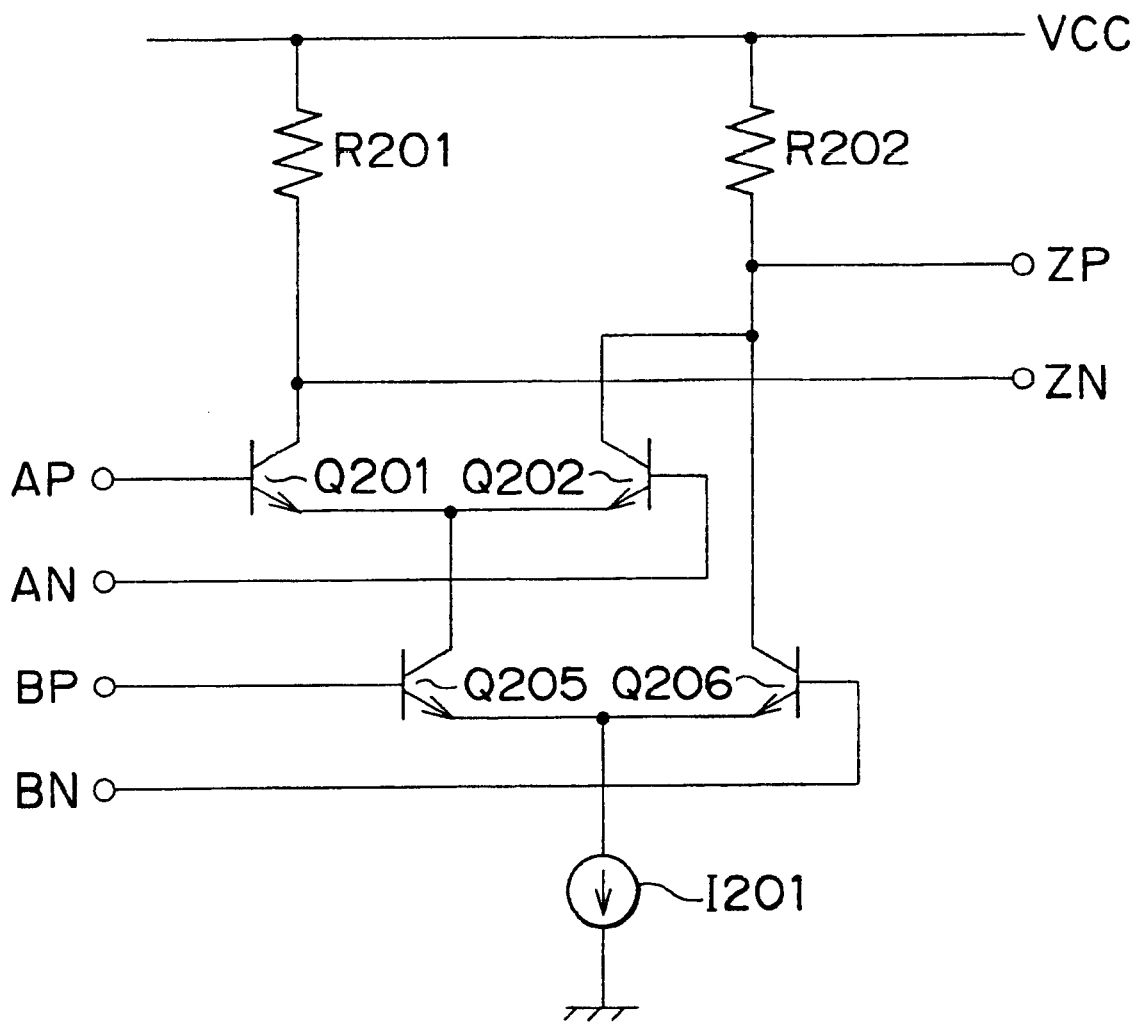
FIG. 15 is a circuit diagram showing an AND circuit formed from differential pairs connected in series gating.
Figure 16:
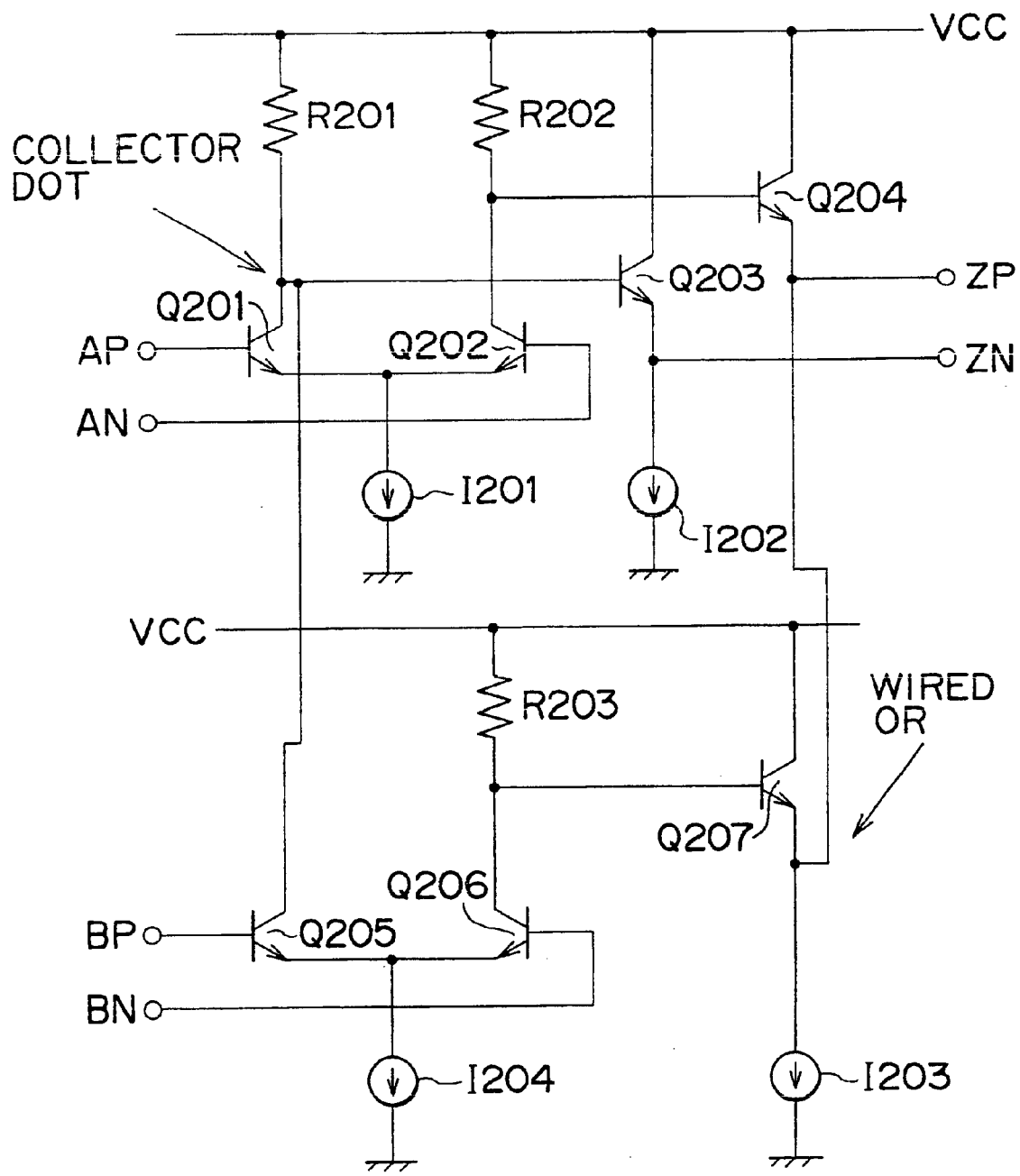
FIG. 16 is a circuit diagram showing an OR circuit which includes a wired OR connection and a collector dot.
Figure 17:
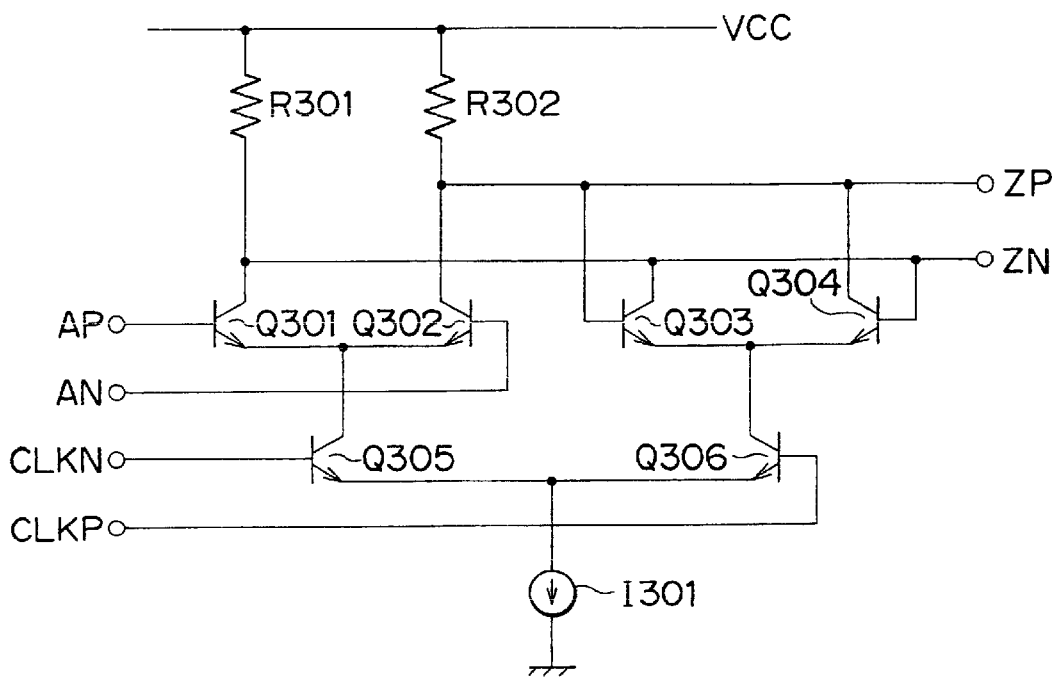
FIG. 17 is a circuit diagram showing a latched comparator circuit.
Figure 18:
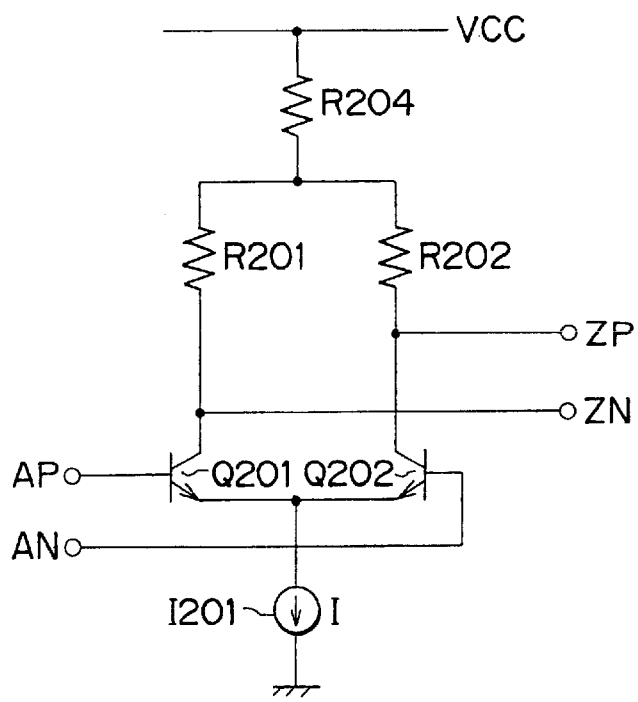
FIG. 18 is a circuit diagram showing a level shift circuit.

This is realized by the majority circuit according to the present working example, and an example of the circuit is shown in FIG. 12. Referring to FIG. 12, the majority circuit shown includes, for example, three differential circuits 71, 72 and 73 each having an output stage of an emitter follower configuration, and an output amplification circuit 74 for which the logic circuit according to the second embodiment is used.

The differential circuit 71 includes a basic circuit which in turn includes differential pair transistors Q111 and Q112 whose emitters are connected commonly, a current source I71 connected between the emitter common connecting point of the differential pair transistors Q111 and Q112 and the ground, and a pair of resistors R71 and R72 connected between the collectors of the differential pair transistors Q111 and Q112 and a power supply line of a power supply voltage VCC, respectively.

The differential circuit 71 further includes an output stage of an emitter follower configuration which includes a pair of transistors Q113 and Q114 whose bases are connected to the collector of the transistor Q112, another pair of transistors Q115 and Q116 whose bases are connected to the collector of the transistor Q111, and a pair of current sources I72 and I73 connected between the emitters of the transistor Q114 and Q116 and the ground, respectively.

Also the differential circuit 72 includes, similarly to the differential circuit 71, a basic circuit which in turn includes differential pair transistors Q117 and Q118, a current source I74, and a pair of resistors R73 and R74. The differential circuit 72 further includes an output stage of an emitter follower configuration which includes a pair of transistors Q119 and Q120 whose bases are connected to the collectors of the transistor Q118, another pair of transistors Q121 and Q122 whose bases are connected to the collector of the transistor Q117, and a pair of current sources I75 and I76 connected between the emitters of the transistors Q119 and Q120 and the ground, respectively.

Also the differential circuit 73 similarly includes a basic circuit which in turn includes differential pair transistors Q123 and Q124, a current source I77, and a pair of resistors R75 and R76. The differential circuit 73 further includes an output stage of an emitter follower configuration which includes a pair of transistors Q125 and Q126 whose bases are connected to the collector of the transistor Q124, another pair of transistors Q127 and Q128 whose bases are connected to the collector of the transistor Q123, and a pair of current sources I78 and I79 connected between the emitters of the transistors Q127 and Q128 and the ground, respectively.

The output amplification circuit 74 includes a pair of level shift amplitude amplification circuits 75 and 76 configured using the logic circuit according to the second embodiment, and a differential circuit 77.

The level shift amplitude amplification circuit 75 includes a transistor Q129 whose emitter is connected to the emitters of the transistor Q113 and Q119, another transistor Q130 whose emitter is connected to the emitters of the transistors Q120 and Q125, a further transistor Q131 whose emitter is connected to the emitters of the transistor Q114 and Q126, and a pair of resistors R77 and R78 connected in series between the collectors of the transistors Q129, Q130 and Q131 and a power supply line of a power supply voltage VCC. The bases of the transistors Q129, Q130 and Q131 are connected to a common connecting point of the resistors R77 and R78.

Similarly, the level shift amplitude amplification circuit 76 includes a transistor Q132 whose emitter is connected to the emitters of the transistors Q121 and Q127, another transistor Q133 whose emitter is connected to the emitters of the transistors Q115 and Q128, a further transistor Q134 whose emitter is connected to the emitters of the transistors Q116 and Q122, and a pair of resistors R79 and R80 connected in series between the collectors of the transistors Q132, Q133 and Q134 and the power supply line. The bases of the transistors Q132, Q133 and Q134 are connected to a common connecting point of the resistors R79 and R80.

The differential circuit 77 includes differential pair transistors Q135 and Q136 whose emitters are connected commonly and whose bases are connected to the output terminals of the level shift amplitude amplification circuits 75 and 76, that is, the collector common connecting point of the transistors Q129, Q130 and Q131 and the collector common connecting point of the transistors Q132, Q133 and Q134, respectively, a current source I80 connected between the emitter common connecting point of the differential pair transistors Q135 and Q136 and the ground, and a pair of resistors R81 and R82 connected between the collectors of the differential pair transistors Q135 and Q136 and the power supply line, respectively.

In the circuit configuration described above, the transistors Q113 and Q119, the transistors Q120 and Q125, the transistors Q114 and Q126, the transistors Q121 and Q127, the transistors Q115 and Q128 and the transistors Q116 and Q122 are used in a wired OR connection and the transistors Q129, Q130 and Q131 and the transistors Q132, Q133 and Q134 are used in a collector dotting connection to realize a differential majority circuit.

Also in the majority circuit having the configuration described above, the logic circuit according to the first embodiment, that is, the folding circuit, can be used in place of the level shift amplitude amplification circuit 75 or 76.

It is to be noted that, while, in the embodiments and the working examples described hereinabove, a bipolar transistor is used for the transistors, the present invention can be applied similarly also where a MOS transistor is used.

While preferred embodiments of the present invention have been described using specific terms, such description is for illustrative purposes only, and it is to be understood that changes and variations may be made without departing from the spirit or scope of the following claims.

What is claimed is:

1. A logic circuit, comprising:
   a drive circuit including at least two emitter follower circuits or source follower circuits; and
   a folding circuit including a set of transistors of a diode connection individually having first terminals connected to output terminals of said emitter follower circuits or source follower circuits or a wired OR connection of the output terminals and second terminals connected commonly and connected to a power supply line through a resistor,
   wherein said drive circuit further includes a plurality of differential circuits provided corresponding to said emitter follower circuits or source follower circuits and each of said emitter follower circuits or source follower circuits includes two transistors corresponding to differential outputs of each of said differential circuits, and the first terminals of said transistors of said folding circuit are connected to ones of said emitter follower output terminals or source follower output terminals of said differential circuits, said folding circuit further including a transistor of a diode connection having a first terminal connected commonly to the other emitter follower output terminals or source follower output terminals of said differential circuits and a second terminal connected to said power supply line through a resistor.

2. A logic circuit according to claim 1, wherein said folding circuit is provided corresponding to the differential outputs of said differential circuits.

3. A logic circuit, comprising:
   a drive circuit including at least two emitter follower circuits or source follower circuits; and
   a folding circuit including as set of transistors of a diode connection individually having first terminals connected to output terminals of said emitter follower circuits or source follower circuits or a wired OR connection of the output terminals and second terminals connected commonly and connected to a power supply line through a resistor,
   wherein said drive circuit further includes a plurality of differential circuits provided corresponding to said emitter follower circuits or source follower circuits and each of said emitter follower circuits or source follower circuits includes two transistors corresponding to differential outputs of each of said differential circuits, and the first terminals of said transistors of said folding circuit are connected to combinations of those of emitter follower output terminals or source follower output terminals of said differential circuits which output the logic true, said following circuit further including another set of transistors of a diode connection individually having first terminals connected to combinations of those of the emitter follower output terminals or source follower output terminals of said differential circuits which output the logic false and second terminals connected commonly and connected to said power supply line through a resistor.

4. A logic circuit according to claim 3, wherein said folding circuit is provided corresponding to the differential outputs of said differential circuits.

5. A logic circuit, comprising:
   a drive circuit including a plurality of differential circuits each having an output stage of an emitter follower configuration or a source follower configuration;
   a selector circuit including a differential circuit having, at an output stage thereof, a plurality of systems of emitter followers or source followers provided corresponding to said differential circuits of said drive circuit, said differential circuits of said drive circuit and emitter follower output terminals or source follower output terminals of said differential circuit of said selector circuit being connected commonly for the individual systems, said selector circuit selecting the differential outputs of one of said differential circuits of said drive circuit in response to a select signal; and
   a folding circuit including a set of transistors of a diode connection individually having first terminals connected to ones of the emitter follower output terminals or source follower output terminals of said differential circuits connected commonly between said differential circuits and said selector circuit and second terminals connected commonly and connected to a power supply line through a resistor, and a transistor of a diode connection having a first terminal connected commonly to the other emitter follower output terminals or source follower output terminals connected commonly and a second terminal connected to said power supply line through a resistor.

6. A logic circuit according to claim 5, wherein said folding circuit is provided corresponding to the differential outputs of said differential circuits.

7. A logic circuit, comprising:
   first and second differential circuits each having an output stage of an emitter follower configuration or a source follower configuration;
   a third differential circuit having an output stage having two systems of emitter followers or source followers provided corresponding to said first and second differential circuits, said emitter followers or source followers having output terminals connected commonly to said first and second differential circuits for the individual systems, said third differential circuit operating in response to a clock signal; and
   a folding circuit including a set of transistors of a diode connection individually having first terminals connected to ones of the emitter follower output terminals or source follower output terminals connected commonly between said first and second differential circuits and said third differential circuits and second terminals connected commonly and connected to a power supply line through a resistor, and a transistor of a diode connection having a first terminal connected commonly to the others of the emitter follower output terminals or source follower output terminals connected commonly and a second terminal connected to said power supply line through a resistor, an output of said folding circuit being positively fed back to said second differential circuit.

8. A logic circuit, comprising:
   a drive circuit including at least two emitter follower circuits or source follower circuits; and
   a folding circuit including a first resistor having a terminal connected to a power supply line, a second resistor having a terminal connected to the other terminal of said first resistor, and a set of transistors individually having control terminals connected to the common connecting point of said first and second resistors, first terminals connected individually to output terminals of said emitter follower circuits or source follower circuits or connected to a wired OR connection of the output terminals of said emitter follower circuits or source follower circuits, and second terminals connected to the other terminal of said second resistor.

9. A logic circuit, comprising:
a drive circuit including at least two emitter follower circuits or source follower circuits and a plurality of differential circuits corresponding to said emitter follower circuits or source follower circuits, each of said emitter follower circuits or source follower circuits including two transistors corresponding to differential outputs of said differential circuits; and a folding circuit including a first resistor having a terminal connected to a power supply line, a second resistor having a terminal connected to the other terminal of said first resistor, a set of transistors individually having control terminals connected to the common connecting point of said first and second resistors, first terminals connected individually to ones of the emitter follower output terminals or source follower output terminals of said differential circuits, and second terminals connected to the other terminal of said second resistor, and a transistor having a first terminal connected commonly to the other emitter follower output terminals or source follower output terminals of said differential circuits and a second terminal connected to the other terminal of said second resistor.

10. A logic circuit according to claim 9, wherein said folding circuit is provided corresponding to the differential outputs of said differential circuits.

11. A logic circuit, comprising:
a drive circuit including at least two emitter follower circuits or source follower circuits and a plurality of differential circuits corresponding to said emitter follower circuits or source follower circuits, each of said emitter follower circuits or source follower circuits including two transistors corresponding to differential outputs of said differential circuits; and a folding circuit including a first resistor having a terminal connected to a power supply line, a second resistor having a terminal connected to the other terminal of said first resistor, a set of transistors individually having control terminals connected to the common connecting point of said first and second resistors, first terminals connected individually to combinations of the emitter follower output terminals or source follower output terminals of said differential circuits which output the logic true, and second terminals connected to the other terminal of said second resistor, and another set of transistors individually having first terminals connected to combinations of the emitter follower output terminals or source follower output terminals of said differential circuits which output the logic false and second terminals connected to the other terminal of said second resistor.

12. A logic circuit according to claim 11, wherein said folding circuit is provided corresponding to the differential outputs of said differential circuits.

13. A logic circuit, comprising:
a drive circuit including a plurality of differential circuits each having an output stage of an emitter follower configuration or a source follower configuration;

a selector circuit including a differential circuit having, at an output stage thereof, a plurality of systems of emitter followers or source followers provided corresponding to said differential circuits of said drive circuit, said differential circuits of said drive circuit and emitter follower output terminals or source follower output terminals of said differential circuit of said selector circuit being connected commonly for the individual systems, said selector circuit selecting the differential outputs of one of said differential circuits of said drive circuit in response to a select signal; and a folding circuit including a first resistor having a terminal connected to a power supply line, a second resistor having a terminal connected to the other terminal of said first resistor, a set of transistors individually having control terminals connected to the common connecting point of said first and second resistors, first terminals connected individually to ones of the emitter follower output terminals or source follower output terminals connected commonly between said differential circuits and said selector circuit, and second terminals connected to the other terminal of said second resistor, and a transistor having a first terminal connected to the others of the emitter follower output terminals or source follower output terminals connected commonly and a second terminal connected to the other terminal of said second resistor.

14. A logic circuit according to claim 13, wherein said folding circuit is provided corresponding to the differential outputs of said differential circuits.

15. A logic circuit, comprising:
first and second differential circuits each having an output stage of an emitter follower configuration or a source follower configuration;

a third differential circuit having an output stage having two systems of emitter followers or source followers provided corresponding to said first and second differential circuits, said emitter follower output terminals or source follower output terminals having output terminals connected commonly to said first and second differential circuits for the individual systems, said third differential circuit operating in response to a clock signal; and a folding circuit including a first resistor having a terminal connected to a power supply line, a second resistor having a terminal connected to the other terminal of said first resistor, a set of transistors individually having control terminals connected to the common connecting point of said first and second resistors, first terminals connected individually to ones of the emitter follower output terminals or source follower output terminals connected commonly between said first and second differential circuits and said third differential circuit, and second terminals connected to the other terminal of said second resistor, and a transistor having a first terminal connected to the others of the emitter follower output terminals or source follower output terminals connected commonly and a second terminal connected to the other terminal of said second resistor.

* * * * *